(12) United States Patent
Kelbon et al.

(10) Patent No.: US 7,552,024 B2
(45) Date of Patent: Jun. 23, 2009

(54) CIRCUIT BOARD DIAGNOSTIC OPERATING CENTER

(76) Inventors: Richard G. Kelbon, 9981 Kingston Farm Rd., Kingston, WA (US) 98346; Kraig D. Mitzner, 5033 NW. Dream Ct., Silverdale, WA (US) 98383

( * ) Notice: Subject to any disclaimer, the term of this patent is extended or adjusted under 35 U.S.C. 154(b) by 239 days.

(21) Appl. No.: 11/073,771

(22) Filed: Mar. 7, 2005

(65) Prior Publication Data

US 2005/0209808 A1   Sep. 22, 2005

Related U.S. Application Data

(60) Provisional application No. 60/551,261, filed on Mar. 8, 2004.

(51) Int. Cl.
*G06F 3/00* (2006.01)
(52) U.S. Cl. .................. 702/117; 702/119; 702/120; 702/121
(58) Field of Classification Search ............ 702/108, 702/109, 117, 121, 123, 127, 118, 119, 120; 340/825; 703/21, 22; 717/124, 125, 126
See application file for complete search history.

(56) References Cited

U.S. PATENT DOCUMENTS

| | | | |
|---|---|---|---|
| 4,525,789 A * | 6/1985 | Kemper et al. | ............... 702/117 |
| 4,901,221 A | 2/1990 | Kodosky | |
| 4,914,568 A | 4/1990 | Kodosky | |
| 5,504,917 A | 4/1996 | Austin | |
| 5,644,115 A | 7/1997 | Knauer | |
| 5,784,275 A | 7/1998 | Sojoodi | |
| 6,053,951 A | 4/2000 | McDonald | |
| 6,064,812 A | 5/2000 | Parthasarathy | |
| 6,102,960 A * | 8/2000 | Berman et al. | ................. 703/17 |
| 6,137,308 A * | 10/2000 | Nayak | .......................... 326/39 |
| 6,173,438 B1 | 1/2001 | Kodosky | |
| 6,219,628 B1 | 4/2001 | Kodosky | |
| 6,377,912 B1 * | 4/2002 | Sample et al. | ................ 703/28 |
| 6,401,220 B1 | 6/2002 | Grey | |
| 6,473,707 B1 | 10/2002 | Grey | |
| 6,560,572 B1 | 5/2003 | Balaram | |
| 6,577,981 B1 | 6/2003 | Grey | |

(Continued)

OTHER PUBLICATIONS

"Essential Technologies for Test," *Instrumentation Newsletter* 17 No. 1:2 (Fall 2005).

(Continued)

*Primary Examiner*—Edward Raymond
*Assistant Examiner*—Felix E Suarez
(74) *Attorney, Agent, or Firm*—Marcia S. Kelbon

(57) ABSTRACT

A circuit board diagnostic operating center (10) including a large flat panel display (18) used for displaying the test system assets (instruments 12) and the circuit card assembly (CCA) schematic diagram, a small flat panel display (20) to display ancillary information, a computer (24) that executes the system application program and provides the means to communicate with automated test equipment. The diagnostic operating center may contain industry standard programmable equipment and instrumentation, or may contain independent instrumentation, or a combination. Physical CCA signal to operating center instrumentation interconnections are accomplished via a cross-point matrix (16). A graphical user interface (GUI) in combination with diagnostic operating center software and hardware provides an interactive means to visually create and store test sequences by capturing the technician's diagnostic methodology.

21 Claims, 31 Drawing Sheets

U.S. PATENT DOCUMENTS

| | | | |
|---|---|---|---|
| 6,584,601 | B1 | 6/2003 | Kodosky |
| 6,608,638 | B1 | 8/2003 | Kodosky |
| 6,690,981 | B1 | 2/2004 | Kawachi |
| 6,784,902 | B1 | 8/2004 | Melder |
| 6,784,903 | B2 | 8/2004 | Kodosky |
| 6,802,053 | B1 | 10/2004 | Dye |
| 6,907,557 | B2 | 6/2005 | Perez |
| 6,954,904 | B2 | 10/2005 | White |
| 6,971,065 | B2 | 11/2005 | Austin |
| 7,042,469 | B2 * | 5/2006 | Fuller .......................... 345/629 |
| 7,085,670 | B2 * | 8/2006 | Odom et al. ................. 702/127 |
| 2005/0177816 | A1 | 8/2005 | Kudukoli |

OTHER PUBLICATIONS

"SignalExpress Delivers Interactive Measurement Experience" *Instrumentation Newsletter* 17 No. 1:1, 4, 5 (Fall 2005).

"Use High-Density Switching and Flexible Software for ATE," *Instrumentation Newsletter* 17 No. 1:10 (Fall 2005).

"Develop Custom Triggering Applications with LabVIEW FPGA," *Instrumentation Newsletter* 17 No. 1:11 (Fall 2005).

"Designing Communication Algorithms with NI LabVIEW," *Instrumentation Newsletter* 17 No. 1:12 (Fall 2005).

"New LabView Tools Deliver Interactive Control Design," *Instrumentation Newsletter* 17 No. 1:13 (Fall 2005).

"multiSIM Schematic Capture, Simulation & Programmable Logic," *Electronics Workbench* pp. 1-14, 19 (2000).

OrCAD Community and OrCAD Design Suites, http://www.orcad.com/community.aspx and http://www.orcad.com/products.aspx (accessed Oct. 11, 2005).

ATE Components to Complete ATE Systems, http://www.geotestinc.com/products/products.asp, http://www.geotestinc.com/products/ateasy/selection_guide.asp and http://www.geotestinc.com/products/ateasy/tour_1.asp (accessed Aug. 5, 2005).

Micro-Cap Version 8.1.0 Now Available, http://www.spectrum-soft.com/index.shtm and http://www.spectrum-soft.com/demo.shtm (accessed Aug. 18, 2005).

Virtual Rack Explorer, PAL and Storeroom, http://www.virtualrack.com (accessed Aug. 5, 2005).

TestDRIVE Overview, Testing for WebSphere MQ, TestGUI Overview, TestBench-PC Overview, TestPLAN Overview and TestSMART Overview, http://origsoft.com/TestDRIVE_Overview.htm, http://origsoft.com/TestMQ.htm, http://origsoft.com/TestGUI_Overview2.htm, http://origsoft.com/TB-PC_Overview2.htm, http://origsoft.com/TestPLAN_Overview2.htm and http://origsoft.com/TestSMART_overview.htm (accessed Mar. 2, 2005).

TestPoint Development Package, http://www.keithley.com (accessed Nov. 17, 2004).

TestPoint Product Overview, http://www.test-point.com/gen_tp.html, http://www.test-point.com/genspecs.htm and http://www.test-point.com/gen_ver5.htm (accessed Nov. 17, 2004).

SoftWIRE Technology Manual and Brochures, http://www.softwire.com (accessed Feb. 4, 2005).

Rockwell Collins TBGU-IF2:TBAP-5F1 Test Bench for Radio COMM/NAV, Display, http://www.rockwellcollins.com/ecat/gs/Test_Benches_PrintFriendly.html (accessed Mar. 2, 2005).

Serco Test Systems Integration Test Bench, http://sts.serco.com/AircraftStoresManagement/IntegrationTestBench.html (accessed Mar. 2, 2005).

ViTec Automated Test Bench Based on Modern Measurement Technologies, http://www.vitec.ru/en/engl.pho?action=asolutions&subaction=monitor&param1=monitor12 (accessed Mar. 2, 2005).

Another Integrated Solution from KSI Inc., http://www.kesslersystemsinc.com/Active_bench/actbench.html (accessed Mar. 2, 2005).

Credence Product Portfolio: ASL Series, http://www.credence.com/Solutions_PP_ASLSeries.htm (Nov. 21, 2005).

PinPoint Functional and PXI System, http://www.diagnosys.com/Products/PCB_Diagnostics?Pinpoint_II/Pinpoint_II_PX.htm, http://www.diagnosys.com/Products/PCB_Diagnostics/Front_Sheet.htm, http://www.diagnosys.com/Products/PCB_Diagnostics/Faultfinder_Ranger/faultfinder-Sys and http://www.diagnosys.com/About_Us/Press_Releases.htm (accessed Nov. 22, 2005).

WinSoft Customized Software, Hardware and Turn-Key Solutions, http://www.winsoft.com/index.html, http://www.winsoft.com/html/photo_gallery_0.html, http://www.winsoft.com/html/photo_gallery_1.html, http://www.winsoft.com/html/areas_of_expertise.html, http://www.winsoft.com/html/software.html, http://www.winsoft.com/hardware.html, http://www.winsoft.com/html/mechanical_design_fixtures_.html, http://www.winsoft.com/html/wise.html, http://www.winsoft.com/html/atems.html and http://www.winsoft.com/html/ate_life_extensions.html (accessed Nov. 22, 2005).

* cited by examiner

| 70 PORT | 76 INST CONNECTION | SIGNAL | ACCOUNT | CONDITIONAL |
|---|---|---|---|---|
| R1 | INST X, X | OUT | USED | |
| R2 | INST X, Y | IN | USED | |
| R3 | INST X, Z | NONE | NONE | |
| ⋮ | ⋮ | ⋮ | ⋮ | ⋮ |
| RN | INST M, N | BI | USED | |

*FIG. 13*

| 72 PORT | 78 UUT CONNECTION | SIGNAL | ACCOUNT | CONDITIONAL |
|---|---|---|---|---|
| C1 | NAME 1 | OUT | USED | |
| C2 | NAME 2 | IN | USED | |
| C3 | NAME 3 | NONE | NONE | |
| ⋮ | ⋮ | ⋮ | ⋮ | ⋮ |
| CN | NAME N | BI | USED | |

*FIG. 14*

| Port | Instrument | Signal | Account | Conditional |
|---|---|---|---|---|
| R1 | Inst_X_Hi | IN | None | |
| R2 | Inst_X_Lo | REF | None | |
| R3 | Inst_Y_Hi | IN | None | |
| R4 | Inst_Y_Lo | OUT | None | |
| ⋮ | ⋮ | | | |
| RN | Inst_N | | | |

☐ UUT Ports

[Update] [Cancel]

*FIG.15*

| Port | UUT Name | Signal | Account | Conditional |
|---|---|---|---|---|
| C1 | P1-A | | | |
| C2 | P1-B | | | |
| C3 | P1-C | | | |
| C4 | P1-D | | | |
| ⋮ | ⋮ | | | |
| CN | P1-N | | | |

☐ UUT Ports

[Update] [Cancel]

*FIG.16*

| 74 NAME | INST STATUS | UUT STATUS | CONN STATUS | SW POS | CONDITIONAL | |
|---|---|---|---|---|---|---|
| R1C1 | ALLOC | ALLOC | YES | ON | | → ICON SWITCH CONTROL |
| R1C2 | ALLOC | DEALLOC | NO | OFF | | |
| R1C3 | ALLOC | DEALLOC | NO | OFF | | |
| ⋮ | ⋮ | ⋮ | ⋮ | ⋮ | ⋮ | |
| RNCN | DEALLOC | DEALLOC | NO | OFF | | |

- Resource Library
  - DMM (Executables)
    - DMM_ICON
    - DMM_FUNCTION
    - DMM_RANGE
    - DMM_FILTER
    - DMM_READ
    - DMM_CLEAR
    - DMM_QUERY
  - AWFG (Executables)
    - AWFG_ICON
    - AWFG_WAVEFORM
    - AWFG_FREQUENCY
    - AWFG_CLEAR
    - AWFG_QUERY
  - DCP (Executables)
    - DCP_ICON
    - DCP_POWER
    - DCP_CLEAR
    - DCP_QUERY
  - XPSM (Executables)
    - XPSM_ICON
    - XPSM_SWITCH_CONTROL
    - XPSM_CLEAR
    - XPSM_QUERY
  - GND (Executables)
    - GND_ICON
    - GND_CONTROL
    - GND_CLEAR
    - GND_QUERY

*FIG.31*

Matrix Configuration

| Port | INST | UUT | CONN | SW POS | CONDITIONAL |
|---|---|---|---|---|---|
| R1C1 | DMM-HI | P1-1 | NO | OPEN | |
| R1C2 | DMM-HI | P1-2 | NO | OPEN | |
| R1C3 | DMM-HI | P1-3 | NO | OPEN | |
| R1C4 | DMM-HI | P1-4 | YES | CLOSED | |
| R1C5 | DMM-HI | NONE | NO | OPEN | |
| R1C6 | DMM-HI | NONE | NO | OPEN | |
| R1C7 | DMM-HI | NONE | NO | OPEN | |
| R1C8 | DMM-HI | NONE | NO | OPEN | |
| R2C1 | DMM-LO | P1-1 | NO | OPEN | |
| R2C2 | DMM-LO | P1-2 | YES | CLOSED | |
| R2C3 | DMM-LO | P1-3 | NO | OPEN | |
| R2C4 | DMM-LO | P1-4 | NO | OPEN | |
| R2C5 | DMM-LO | NONE | NO | OPEN | |
| R2C6 | DMM-LO | NONE | NO | OPEN | |
| R2C7 | DMM-LO | NONE | NO | OPEN | |
| R2C8 | DMM-LO | NONE | NO | OPEN | |
| R3C1 | AWFG_HI | P1-1 | NO | OPEN | |
| R3C2 | AWFG_HI | P1-2 | NO | OPEN | |
| R3C3 | AWFG_HI | P1-3 | YES | CLOSED | |
| R3C4 | AWFG_HI | P1-4 | NO | OPEN | |
| R3C5 | AWFG_HI | NONE | NO | OPEN | |
| R3C6 | AWFG_HI | NONE | NO | OPEN | |
| R3C7 | AWFG_HI | NONE | NO | OPEN | |
| R3C8 | AWFG_HI | NONE | NO | OPEN | |
| R4C1 | AWFG_LO | P1-1 | NO | CLOSED | |
| R4C2 | AWFG_LO | P1-2 | YES | OPEN | |
| R4C3 | AWFG_LO | P1-3 | NO | OPEN | |
| R4C4 | AWFG_LO | P1-4 | NO | OPEN | |
| R4C5 | AWFG_LO | NONE | NO | OPEN | |
| R4C6 | AWFG_LO | NONE | NO | OPEN | |
| R4C7 | AWFG_LO | NONE | NO | OPEN | |
| R4C8 | AWFG_LO | NONE | NO | OPEN | |

[ OK ]  [ Cancel ]

*FIG. 42A*

Matrix Configuration

| Port | INST | UUT | CONN | SW POS | CONDITIONAL |
|---|---|---|---|---|---|
| R5C1 | DCP-HI | P1-1 | NO | CLOSED | |
| R5C2 | DCP-HI | P1-2 | NO | OPEN | |
| R5C3 | DCP-HI | P1-3 | NO | OPEN | |
| R5C4 | DCP-HI | P1-4 | NO | OPEN | |
| R5C5 | DCP-HI | NONE | NO | OPEN | |
| R5C6 | DCP-HI | NONE | NO | OPEN | |
| R5C7 | DCP-HI | NONE | NO | OPEN | |
| R5C8 | DCP-HI | NONE | NO | OPEN | |
| R6C1 | DCP-LO | P1-1 | NO | OPEN | |
| R6C2 | DCP-LO | P1-2 | NO | CLOSED | |
| R6C3 | DCP-LO | P1-3 | NO | OPEN | |
| R6C4 | DCP-LO | P1-4 | NO | OPEN | |
| R6C5 | DCP-LO | NONE | NO | OPEN | |
| R6C6 | DCP-LO | NONE | NO | OPEN | |
| R6C7 | DCP-LO | NONE | NO | OPEN | |
| R6C8 | DCP-LO | NONE | NO | OPEN | |
| R7C1 | NONE | P1-1 | NO | OPEN | |
| R7C2 | NONE | P1-2 | NO | OPEN | |
| R7C3 | NONE | P1-3 | YES | OPEN | |
| R7C4 | NONE | P1-4 | NO | OPEN | |
| R7C5 | NONE | NONE | NO | OPEN | |
| R7C6 | NONE | NONE | NO | OPEN | |
| R7C7 | NONE | NONE | NO | OPEN | |
| R7C8 | NONE | NONE | NO | OPEN | |
| R8C1 | GND | P1-1 | NO | OPEN | |
| R8C2 | GND | P1-2 | YES | CLOSED | |
| R8C3 | GND | P1-3 | NO | OPEN | |
| R8C4 | GND | P1-4 | NO | OPEN | |
| R8C5 | GND | NONE | NO | OPEN | |
| R8C6 | GND | NONE | NO | OPEN | |
| R8C7 | GND | NONE | NO | OPEN | |
| R8C8 | GND | NONE | NO | OPEN | |

[ OK ]   [ Cancel ]

*FIG. 42B*

CIRCUIT BOARD DIAGNOSTIC OPERATING CENTER

CROSS REFERENCE TO RELATED APPLICATION

The present application claims the benefit of the filing date of U.S. Provisional Patent Application Ser. No. 60/551,261 filed Mar. 8, 2004 under 35 USC §119.

BACKGROUND OF THE INVENTION

This invention relates to the diagnostics of circuit card assemblies (CCAs) or other electronic circuits for troubleshooting in a manufacturing or repair facility and the validation of prototypes and new designs. A typical test sequence for conventional troubleshooting and repair may involve two main functions: (1) to test a defective CCA using an automated testing device; and (2) to manually troubleshoot the CCA by providing the necessary input power and stimulus functions to diagnose the automated test failure to the individual failed component.

The first function, generation of the automated test, is typically performed by an engineer who may follow the following representative development sequence:
  a. Review the CCA test requirements.
  b. Review the CCA schematic.
  c. Review the CCA physical requirements.
  d. Review the host test system capability.
  e. Design each electrical test of the CCA requirements with respect to the host test system.
  f. Design a physical interface which allows connection of the CCA to the host test system.
  g. Manufacture an interface between the CCA-to-test-system.
  h. Write CCA test code.
  i. Debug CCA test code.
  j. Generate the respective CCA test documentation.

The test sequence for new prototypes or CCAs under development may involve many iterations of design and redesign, simulation, and testing and evaluation. Testing of new designs typically may be performed in a manual or limited automated test environment, because the test design may undergo as many redesigns as the target CCA.

The conventional automated test generation sequence is typically time consuming and expensive. The expense of conventional automated test generation, while inefficient, may be recovered if a sufficient number of CCAs are tested, such as in a high volume, new production process. The repair process differs in that the volume of CCAs is typically significantly less, making the cost of the automated test generation impractical, but in many cases still necessary to meet the customer's needs.

After automated testing, the second function, manual troubleshooting of the CCA, is typically performed by a technician who may follow the following sequence steps:
  a. Review the CCA test failure or design specifications with respect to the test requirements.
  b. Review the CCA schematic.
  c. Review the CCA physical requirements.
  d. Devise a method to manually apply power and stimulus to the CCA in an effort to duplicate the automated test or performance failures.
  e. Diagnose the fault to the failed component.
  f. Replace the failed component.
  g. Manually test the CCA to verify that the repair or rework was successful.
  h. Test the CCA using the automated test to ensure full CCA functional compliance.

Manual test and diagnostics of each defective CCA is typically labor intensive because it requires individual attention to connect the CCA to the manual test device and to manually perform associated instrumentation setups for test diagnostics. Once the diagnostics are complete, intelligence gleaned during the process is lost by dismantling the test setup through physical disconnection and changing of instrumentation settings. While instrumentation costs associated with manual testing are typically lower than those associated with automated testing, the need to repeat the entire manual testing process for subsequent identical CCAs tested at other times renders the process very inefficient.

In past years, technicians have occasionally resorted to using physical templates that can be overlaid onto a manual cross-point matrix, with apertures formed to indicate where test equipment leads should be connected to the CCA. While creating a record of instrument to CCA connection, this method is cumbersome, potentially inaccurate, and is subject to destruction during the period of storage between tests.

Various software programs have been developed to assist the automated testing engineer with discreet portions of the test development process. The LABVIEW™ program from National Instruments Corporation, Austin Tex. is a test program development tool that provides a graphical environment for creating test, measurement and control routines, using graphical drivers to represent instrument controls and switching. A related type of program available from Keithley Instruments, Inc. as the TESTPOINT™ development package provides a graphical programming aid for application code creation by dragging and dropping objects representing graphs, displays, and other parts of a test on a display panel and listing desired test actions. While providing a way to create test applications without drafting new code, this program does not represent the CCA schematic in the graphical environment, does not interface with the CCA or actual instruments, and does not effectuate an actual CCA test.

Another tool that may be used by engineers is the PSPICE® program from Cadence Design Systems, Inc., which provides a predictive simulated graphical analytical environment as an aid for designing circuits. This program allows an engineer to draw and graphically illustrate a circuit on a display, and the program will then create a suggested circuit board layout and predict the outcome of simulate tests run on the circuit. However, the program works only with Spice type language drawings, does not provide for graphical or actual connection of instruments to the CCA, does include actual instrumentation, and does not provide for testing of actual CCAs.

SUMMARY OF THE INVENTION

A first aspect of the present invention provides a diagnostic system for testing a circuit card assembly (each CCA unit under test being a "UUT") having input and/or output signal ports, comprising: one or more test instruments each defining input and/or output signal ports; an interface connectable to the UUT ports; a multipoint switch matrix connectable between the UUT interface and the instrument ports; a graphical display for displaying a schematic image of the UUT including the UUT ports and icons representing the instrument ports; a user input device; a processor for directing electrical connections made between the UUT ports and the instrument ports via the switch matrix in response to actions of a user, input through the input device and displayed graphically on the display, and for directing test functions input by the user to be performed on the UUT; a communications bus for communication between the other system components; and a memory device for tracking and storing a sequence of the port connections and test function actions.

A further aspect of the present invention provides a diagnostic system for testing a UUT having input and/or output signal ports, comprising: one or more test instruments each defining input and/or output signal ports; an interface connectable to the UUT ports; a multipoint switch matrix connectable between the UUT interface and the instrument ports; a graphical display for displaying a schematic image of the UUT including the UUT ports and icons representing the instrument ports; a user input device; a processor for directing creation of electrical connections between the UUT ports and the instrument ports via the switch matrix in response to actions of a user input through the input device and displayed graphically on the display; a communications bus for communication between the other system components; and a memory device for storing the port connections.

A further aspect of the present invention provides a diagnostic system for testing a UUT using one or more instruments, comprising: a multipoint switch matrix; an instrument interface connectable to the input and/or output signal ports of the one or more test instruments; a UUT interface connectable to input and/or output signal ports of the UUT; a display interface connectable to a graphical display; an input interface connectable to a user input device; a processor in communication with and directing creation of electrical connections between the UUT ports and the instrument ports via the switch matrix in response to actions of a user, input through the input device and displayed graphically on the display, and for directing test functions input by the user to be performed on the UUT; and a memory device for storing a sequence of the port connections and test function actions.

A further aspect of the present invention provides a diagnostic system for setting up a UUT to be tested using one or more instruments, comprising: a multipoint switch matrix; an instrument interface connectable to the input and/or output signal ports of the one or more test instruments; a UUT interface connectable to input and/or output signal ports of the UUT; a display interface connectable to a graphical display; an input interface connectable to a user input device; a processor in communication with and directing creation of electrical connections between the UUT ports and the instrument ports via the switch matrix in response to actions of a user, input through the input device and displayed graphically on the display; and a memory device for storing the connections.

A further aspect of the present invention provides a system for testing an electronic circuit using one or more test instruments, comprising: means for displaying graphical images of the one or more test instruments and a schematic image of the circuit on a display, the test instrument images and the circuit schematic image each defining one or more signal ports; means for graphically connecting the instrument ports to the circuit schematic ports; means for electrically connecting the circuit ports to the instrument ports via a switch matrix in response to the graphical connections; means for inputting test functions to be performed on the circuit using the instruments; and means for tracking and storing a sequence of the port connection and test function actions.

A further aspect of the present invention provides a method for testing an electronic circuit using one or more test instruments, comprising: displaying graphical images of the one or more test instruments and a schematic image of the circuit on a display, the test instrument images and the circuit schematic image each defining one or more signal ports; graphically connecting the instrument ports to the circuit schematic ports; electrically connecting the circuit ports to the instrument ports via a switch matrix in response to the graphical connections; inputting test functions to be performed on the circuit using the instruments; and tracking and storing a sequence of the port connection and test function actions.

A further aspect of the present invention provides a method for creating a test routine for an electronic circuit, comprising: displaying a graphical image of one or more test instruments and a schematic of a circuit to be tested on a display, the test instrument images and the circuit schematic image each defining one or more signal ports; graphically connecting instrument ports to circuit schematic ports on the display; inputting test functions to be performed on the circuit using the instruments; and tracking and storing a sequence of the port connection and test function actions.

A further aspect of the present invention provides a method for creating and storing a test routine for an electronic circuit, comprising: displaying a graphical image of one or more test instruments and a dumb schematic of a circuit to be tested on a display, the test instrument images and the circuit schematic image each defining one or more signal ports; connecting instrument ports to circuit schematic ports on the display; inputting test functions to be performed on the circuit using the instruments; and tracking and storing a sequence of the port connection and test function actions.

A further aspect of the present invention provides a method for creating a test setup for an electronic circuit, comprising: displaying a graphical image of one or more test instruments and a schematic of a circuit to be tested on a display, the test instrument images and the circuit schematic image each defining one or more signal ports; graphically connecting instrument ports to circuit schematic ports; and storing the instrument port to circuit schematic port connections to create a test set up.

A further aspect of the present invention provides a method for creating a test setup for an electronic circuit, comprising: displaying a graphical image of one or more test instruments and a schematic of a circuit to be tested on a display, the test instrument images and the circuit schematic image each defining one or more signal ports; graphically connecting instrument ports to circuit schematic ports on the display; and electrically connecting the ports of the circuit to the ports of the instruments through a switch matrix in response to the graphical connections.

A further aspect of the present invention provides a method for testing an electronic circuit, comprising: displaying a graphical image of one or more test instruments and a schematic of a circuit to be tested on a display, the test instrument images and the circuit schematic image each defining one or more signal ports; graphically connecting instrument ports to circuit schematic ports on the display; electrically connecting the ports of the circuit to the ports of the instruments through a switch matrix in response to the graphical connections; inputting a sequence of test functions to be performed on the circuit using the instruments; and performing the test function sequence on the circuit using the instruments.

The present invention provides a means to interactively create and store test setups and sequences by capturing the technician's diagnostic methodology. The created interactive virtual environment allows a technician to graphically connect (visually connect on a displayed image) workstation instruments to a displayed circuit card or other schematic on the display while the corresponding physical actions (electrical connections) occur transparently. The action sequence of the technician may be captured (tracked and stored) for future use, and each completed action sequence may be chained together to provide an automated test sequence, thus eliminating the need for an engineer to create automated test sequences on a separate test device.

In a preferred embodiment, a circuit diagnostic system constructed in accordance with the present invention includes application program code containing intelligence that provides a technician with a graphical user interface allowing visual connection of workstation instrumentation to the circuit schematic while transparently performing the physical actions and recording the methodology. The preferred embodiment of the invention also includes a cross-point matrix that allows sufficient points of connection, current carrying capacity and ruggedness, and flexibility for practical application to diagnose a broad variety of general circuits without special consideration of which matrix points can handle which aspects of the circuitry. The cross-point matrix provides the connectivity of the test instrumentation to the CCA by providing the ability to allow any point-to-point or multiple point-to-point interconnections. This eliminates the time needed to specify the interconnectivity of the test station switches as would be done during conventional automated test development process.

BRIEF DESCRIPTION OF THE DRAWINGS

FIG. 13 provides an instrument port spreadsheet showing the assignment of test instrument ports in accordance with an embodiment of the present invention.

FIG. 14 provides a UUT port spreadsheet showing the assignment of circuit ports in accordance with an embodiment of the present invention.

FIG. 15 illustrates a display screen shot showing the instrument port spreadsheet in accordance with an embodiment of the present invention.

FIG. 16 illustrates a display screen shot showing the UUT port spreadsheet in accordance with an embodiment of the present invention.

FIG. 31 illustrates the populated test instrument resource library for the embodiment of FIG. 29.

FIGS. 42A and 42B illustrate a switch matrix configuration spreadsheet for the embodiment of FIG. 35.

DETAILED DESCRIPTION OF THE PREFERRED EMBODIMENTS

Figure 1:
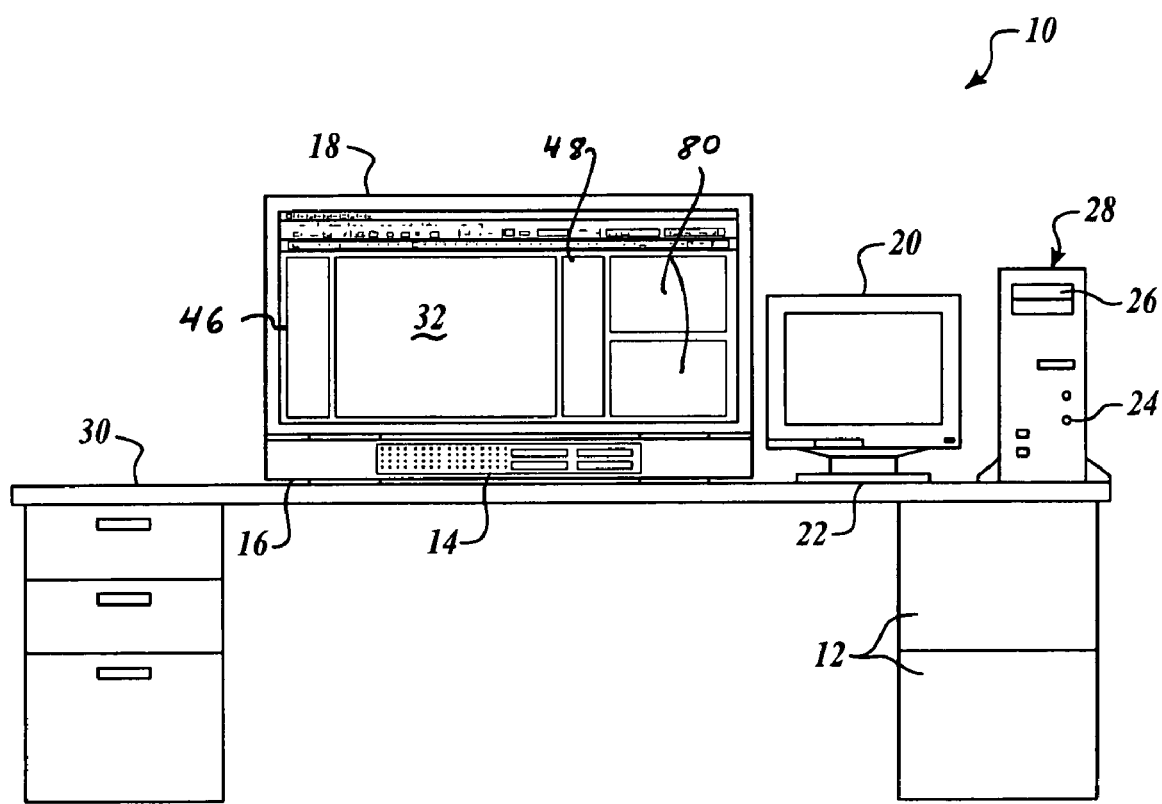
FIG. 1 illustrates a diagnostic system workstation constructed in accordance with an embodiment of the present invention.

An embodiment of a circuit diagnostic system of the present invention installed within a diagnostic and operating center 10 is shown in FIG. 1. The operating center includes a plurality of test instruments 12, an electromechanical interface 14 for physical and electrical connection to the signal ports of a circuit card assembly (CCA) unit under test (UUT) (not shown), a switch matrix 16 for connecting the signal ports of the instruments 12 to the signal ports of the UUT via the UUT interface 14, a graphical display 18 displaying a virtual work environment, a secondary display 20, one or more user input devices 22, a central processor unit (CPU) 24 and a memory device 26 contained within a personal computer 28 and a communications bus (not shown) connecting the system hardware, all housed on or within a workstation 30.

The test instruments 12 are conventional automated and/or programmable instruments, including without limitation digital multimeters, programmable DC voltage sources, programmable arbitrary waveform generators, other function generators, oscilloscopes, power supplies, virtually programmable instruments, etc., selected and assembled as desired to accommodate the UUTs to be tested and used to provide stimulus and measurement functions. The UUT interface 14 includes a plurality of ports for connecting to the leads of a circuit card assembly (CCA), and may be custom configurable for different CCAs. The switch matrix 16 acts to connect any instrument input/output to any CCA test point. The switch matrix 16 is suitably a programmable N×M crosspoint switch matrix having N rows connectable to the input and/or output signal ports of test instruments 12 and M columns connectable to the input and/or output signal ports of the UUT (via the UUT interface 14). The switch matrix 16 preferably includes a sufficient number of rows and columns, the intersections of which each define a switch, to accommodate the anticipated range of instruments and CCAs to be used, is sufficiently rigorous to handle the maximum anticipated current and voltage, and preferably includes undifferentiated (with respect to power and to voltage and current carrying capacity) switch rows and columns such that they can be assigned to instrument and UUT ports without restriction or special consideration.

The graphical display 18 may be an LCD, plasma, CRT or other visual display, such as a large flat panel display, and is used for displaying icons representing the test system assets (test instruments 12), the CCA schematic diagram, graphical switch connections, application software menus and windows and other information. While all information may be displayed on the graphical display 18, the center 10 may optionally include the secondary display 20, such as a small flat panel or other visual display, and can be used to display ancillary information that would clutter the large screen but would be wanted during a test and diagnostics process.

The computer 28 contains the center's application program, and provides the means to communicate with the test instruments 12 and switch matrix 16, as well as memory for tracking and storing test actions. The workstation 30 table supports the displays 18 and 20, and houses the cross-point switch matrix 16.

The diagnostic system application program may be developed using any conventional operating system, such as a Microsoft WINDOWS®, Lynux, MACINTOSH OS® or specialty operating system, by way of example, so that feature use is familiar. For purposes of illustration only, without limitation, embodiments of the present invention will be described herein as having been developed using a Microsoft WINDOWS® operating system. The application program may suitably be written using any conventional programming language, as well known to those of ordinary skill in the art, such as without limitation C, C++, Visual C++, Basic, VISUAL BASIC™, Pascal, ORACLE™, etc.

On launch of the diagnostic system application program, the display 18 may contain a displayed tool bar. The system identifies and displays on screen the system assets (i.e., test instruments 12) that are available. The system configuration may already be defined, so as to specifically identify instrument 12 port connections to one side (e.g., rows) of the cross-point matrix 16. The system configuration, if already defined, may be changed by adding or removing physical instrument connections and may be redefined through software control, as described further below. A schematic CCA diagram may be imported, such as by scanning a schematic diagram to produce a "dumb" schematic image, which image may then be sized using well known graphical controls. Alternately, a "smart" schematic may be used, e.g., Spice type models, such that symbols and lead lines in the image correspond virtually to components of the CCA. As a less preferred alternate, the schematic may be displayed as a "black box," defining a periphery and input/output ports but not displaying the CCA components. Suitably the display 18 is sized to enable the display of a D-size schematic in the center area of the virtual work environment. The schematic UUT port connection points are each defined through a point-and-click method by selecting an area on the schematic that depicts a connection, defining this virtual point by assigning it a numbered icon which transparently defines the remaining side (columns) of the cross-point matrix 16 connections. The schematic connections produce a table from which hardware interconnections are made to the electro-mechanical UUT interface 14 from the CCA mating connector in a method similar to that of breadboard. The electro-mechanical interface may have any standard configuration, such as an edge connector, low or zero insertion force connector, adapter cable, etc., or may be custom configured. The CCA may then be connected to the system test instruments 12. These aspects of the present invention will be further described in greater detail below after first describing features of the system application software.

1. Application Software Features

Figure 2:
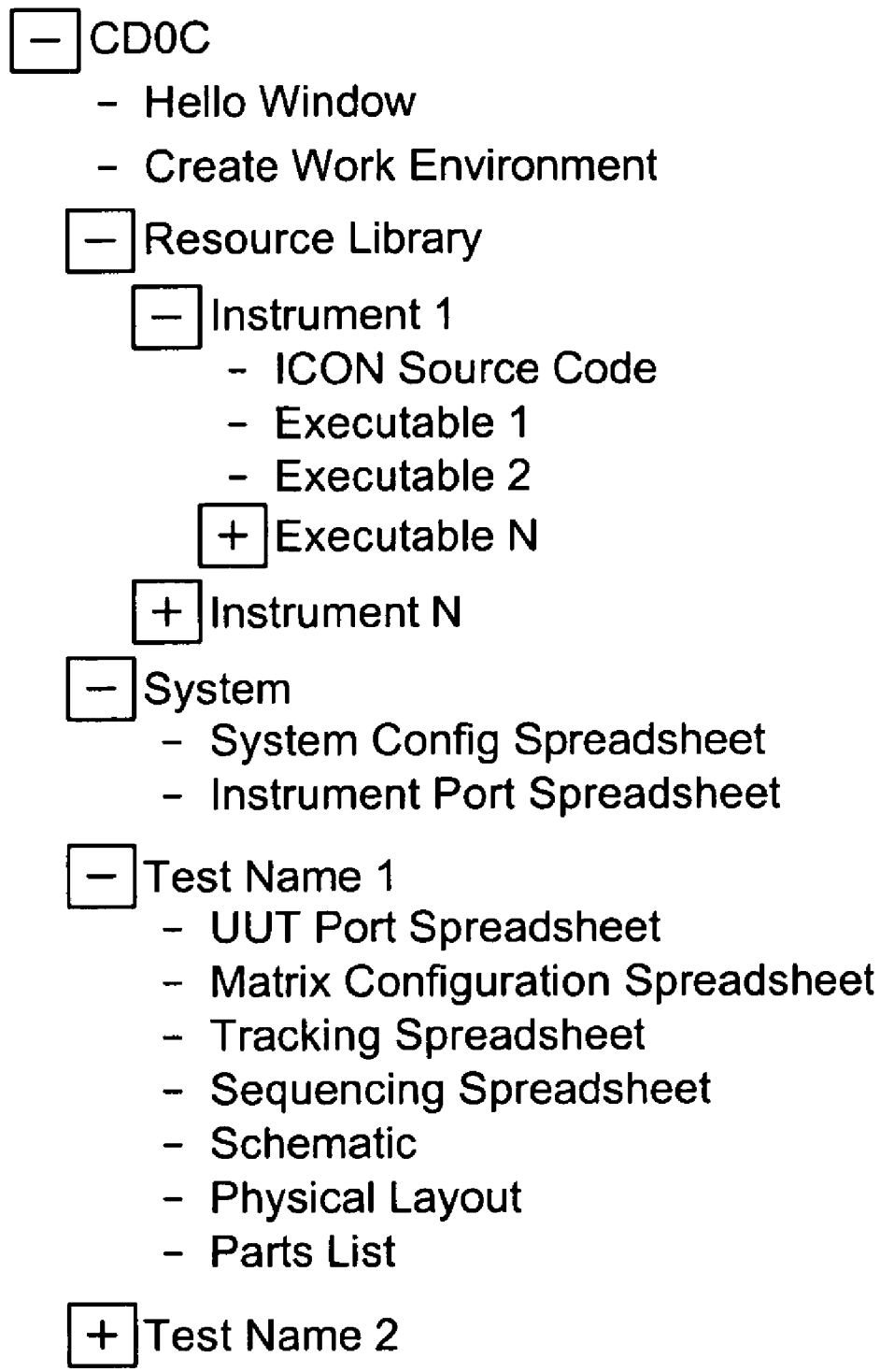
FIG. 2 illustrates the directory structure for an application program developed in accordance with the present invention.

FIG. 2 illustrates the directory structure for one embodiment of the system application software, referred to herein as the circuit board diagnostic operating (CDOC™) application software, and described by way of example only. These aspects are described in terms of programming for use with the Microsoft WINDOWS® operating system, as a suitable operating system base but without limitation. The application software initiates with a "hello" or start window on display 18, and then creates the virtual work environment 32 display. From this point, the user can create, modify and review: (a) the resource library, which provides information on software drivers for all potential test instruments 12, including at a minimum drivers for all instruments 12 actually present in the center 10 but potentially other instruments as well; (b) system information, which includes (i) the system configuration spreadsheet, listing physically installed instruments 12, and (ii) the instrument port spreadsheet, which defines the physical connections made between the instruments 12 and the switch matrix 16; and (c) saved test folders, each including some or all information necessary to perform diagnosis of a particular CCA, including one or more files for (i) a UUT port spreadsheet defining physical connections between the switch matrix 16 and the UUT ports, (ii) a switch matrix configuration spreadsheet defining each switch connected between an instrument port and a UUT port, (iii) a tracking spreadsheet listing a sequence of port configuration and/or functional test steps; (iv) a test sequencing spreadsheet listing multiple tracking sequences that have been chained together; and (v) a UUT schematic, and if desired, a corresponding physical layout for the UUT and a parts list for the UUT.

a. System Initiation

In the illustrated embodiment, as for conventional application programs, the hello window provides information concerning the application software, including version release date and other software status information, and provides active buttons on the display to route the application program to continue on for diagnostic operation, to quit, to update the application software over a connection to the world-wide-web, to access remote instruments or UUTs over the world-wide-web or other wired or wireless network, or to provide user tutorials. Information on prior application software updates can be displayed.

Figure 3:
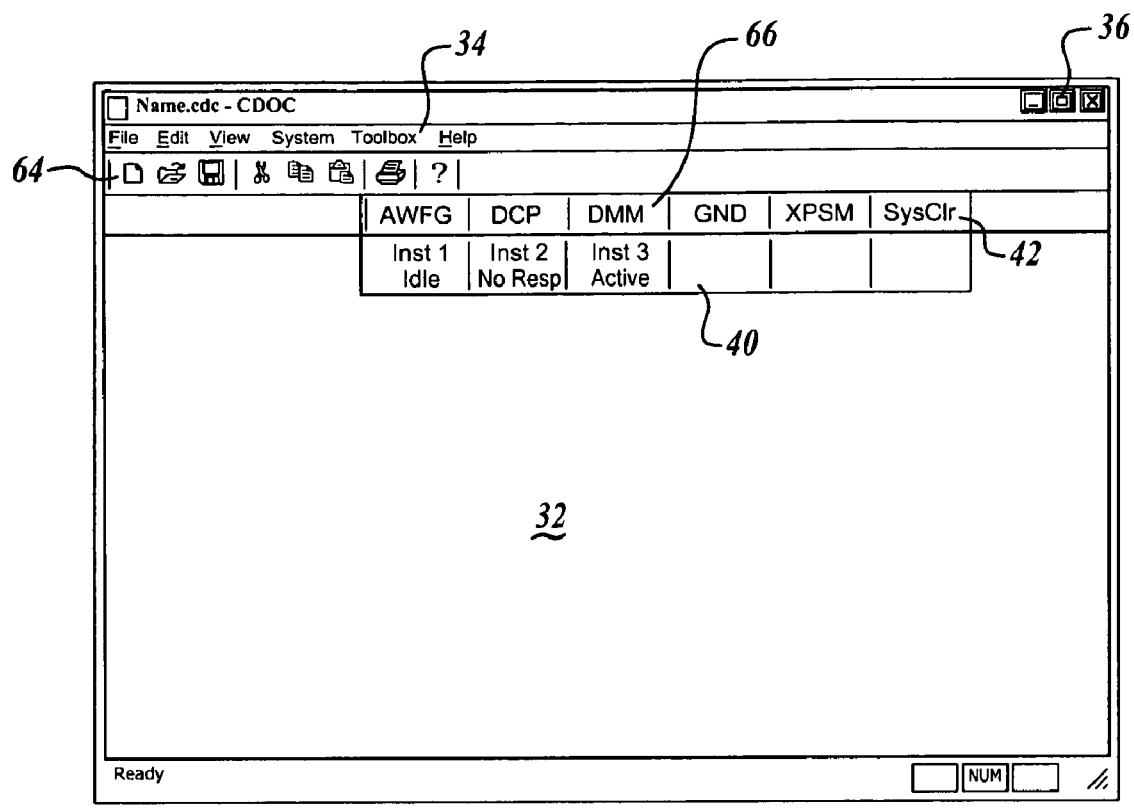
FIG. 3 illustrates a display screen shot showing a virtual work environment for an embodiment of the present invention.
Figure 4:
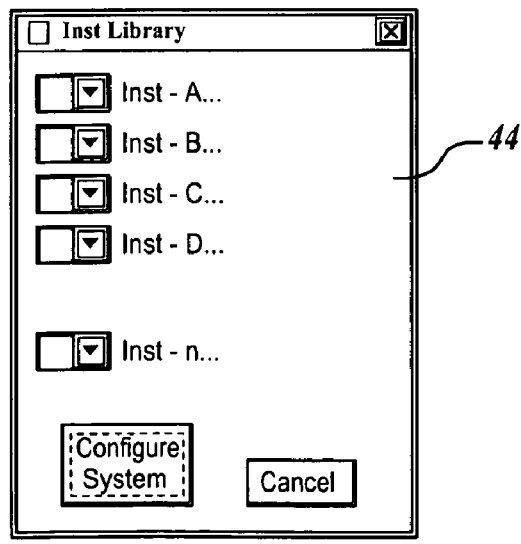
FIG. 4 illustrates a display screen shot showing the configuration of test instruments in accordance with an embodiment of the present invention.

Assuming the user elects to continue on with diagnostic operation, FIG. 3 illustrates the graphical display 18 including a blank virtual work environment 32, on which circuit schematics for UUTs can be displayed. A top toolbar 34 above the virtual work environment 32 conventional window sizing buttons 36 for shrinking, expanding, closing and moving the window, and pull down menus for guiding program operation, to be described further below. A conventional bottom toolbar 38 provides display buttons for accessing other application programs and illustrating other background applications that are concurrently running. The application program routes to the system configuration spreadsheet in an instrument hello file, which contains a list of all available instruments. The program executable sequences down the instrument list, querying each for status. In response, the instrument icons 40 are displayed adjacent the virtual work environment 32, and represent available test instruments 12 included in the system. The instrument icons 40 are displayed as either active or inactive, as designated, for instance, by displaying the icons in dark or shadowed line, or by differing colors (e.g., green for active, red for inactive, yellow for available but has an operational problem). A system clear button 42 can be clicked on to link to an executable program that can be run to clear active instruments. If the instrument hello file is empty, because the system has not yet been configured or has been cleared, the program routes to a system configuration routine. The system configuration window 44 (FIG. 4) allows the user to select and thereby add available test instrument 12 executables from the instrument resource library.

b. Application Pull Down Menus

Figure 5:
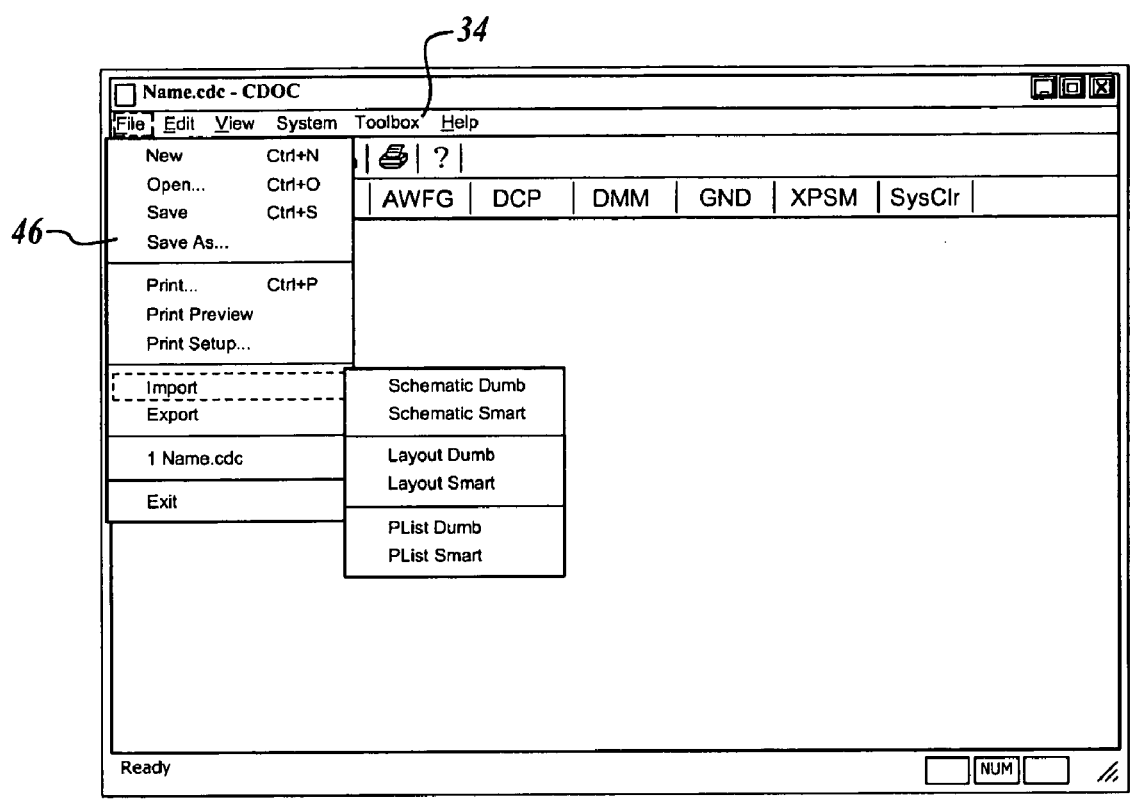
FIG. 5 illustrates a display screen shot showing file menu options including for importing and exporting circuit schematics in accordance with an embodiment of the present invention.

FIG. 5 illustrates application program file options in a "file" menu 46, accessible from the top toolbar 34, in accordance with a preferred embodiment of the invention. It should be understood that displayed terms including menu terms and options are chosen for convenience and may be changed to other terms, with the underlying functionality remaining the same, all within the scope of the present invention. The "new" menu option enables the user to create a new file or folder, e.g., a test folder, a UUT port spreadsheet file, a switch matrix configuration spreadsheet file, a tracking spreadsheet file, a test sequencing spreadsheet file, a UUT schematic, a UUT layout file, or a UUT parts list. The "open" menu option provides a list of valid pre-existing files that may be accessed using the system. The "save" menu option overwrites saved folder or file data with updated data. "Save As" creates a new folder or file under the new name and copies the current folder content or file content into the new folder or file under the new name. "Print" allows printing of the current active screen.

The "import" menu option allows for the importing of either a "dumb" circuit schematic or a "smart" circuit schematic. A "dumb" schematic is a unitary image that portrays information regarding the circuit components, interconnections and functionality to the user, and which can be used to make graphical port connections as described herein below, but otherwise has no functionality. A dumb schematic is the functional equivalent of an electrical schematic drawn on paper. A dumb schematic can be imported in a bit mapped, TIFF, JPEG or any other conventional format, and can be initially created, for example, by scanning a schematic illustrated on paper into an electronic format as is well known in the copying and scanning field. The import routine will recognize the format, convert it into a desired format for display, suitably a bit mapped format, scale the information appropriately, and display the imported schematic image in the virtual work environment 32. Optionally, a black-box schematic image may be displayed.

A "smart" schematic is an image constructed of component images or icons, such as Spice type models, each of which represents a circuit component or interconnection, which can be selected graphically to virtually access the corresponding circuit components or connections. A smart schematic thus contains information about the UUT interconnections and functionality in both visual and mathematical form, and can be used in accordance with an aspect of the present invention to allow output predictions with respect to input stimulus. The smart schematic may be suitably imported in any conventional format. The import routine recognizes the format and creates the files to be placed in the test folder and graphical display information necessary to place a visual schematic representation into the virtual work environment 32. The import routine also provides the UUT signal port locations to allow circuit simulation in conjunction with actual circuit stimulation with respect to the instrument 12 connections made by the user.

In addition to importing dumb and smart schematics, the import feature allows the importation of corresponding dumb and smart layouts and dumb and smart parts lists, which are not necessary for testing, but may aid the user in repair of a CCA.

The "exit" menu option performs a system clear if the system instruments 12 have been active, and checks files for modifications. If no modifications, files are closed, and if changes have been made, the user is prompted to choose whether or not to save changes.

Figure 6:
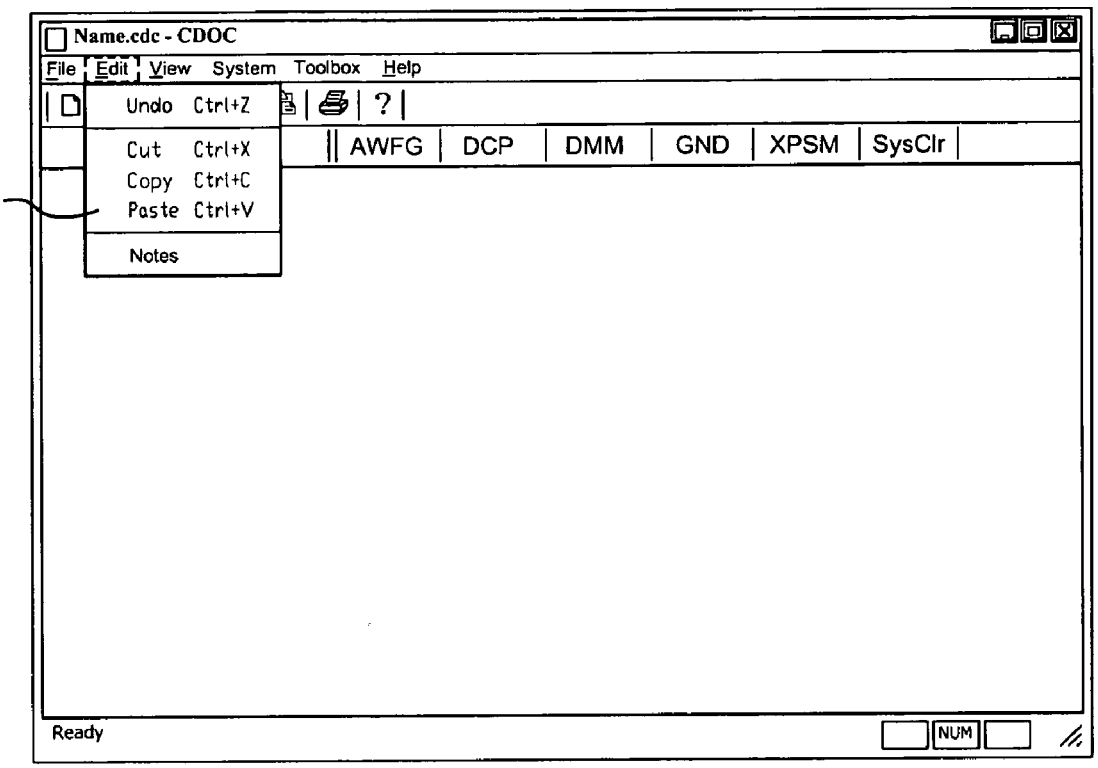
FIG. 6 illustrates a display screen shot showing edit menu options including for the addition of graphic notes to circuit schematics in accordance with an embodiment of the present invention.

FIG. 6 illustrates application program edit options in an "edit" menu 48, accessible from the top toolbar 34, in accordance with a preferred embodiment of the invention. Edit menu functionalities include conventional undo, cut, copy and paste routines that are operable by mouse click and drag action. The edit menu also includes a "notes" function that can be used by the user in accordance with the present invention to add graphical images and/or text to a UUT schematic image in the virtual work environment 32.

Figure 7:
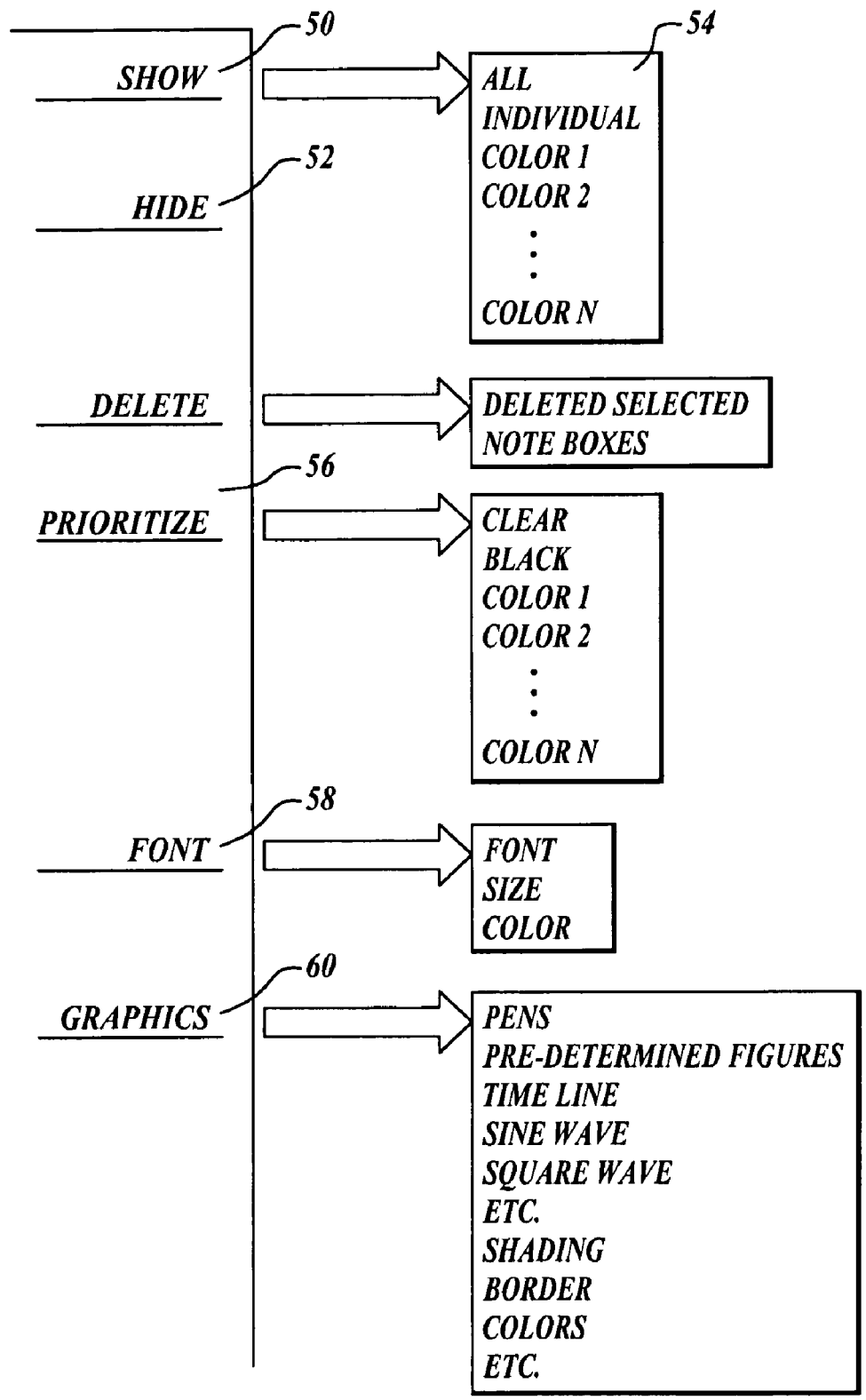
FIG. 7 illustrates application program options for the addition of graphic notes to circuit schematics in accordance with an embodiment of the present invention.

FIG. 7 illustrates pull-down menu options that may suitably be included for the notes function. The added information, displayed in a note box, may be either shown as active (button 50), or hidden (button 52) to remove image clutter. Note boxes may be colored (button 54) or otherwise graphically distinguished to designate priority. Multiple note boxes may be prioritized (button 56) such that more important information is displayed above other information. The information added into a note box may be text and/or other graphic information. Text may be customized (button 58) by font style, size and color. Graphical information (button 60) may include a waveform selected from stored pre-made waveform images, or a custom drawn free-form waveform.

Figure 8:
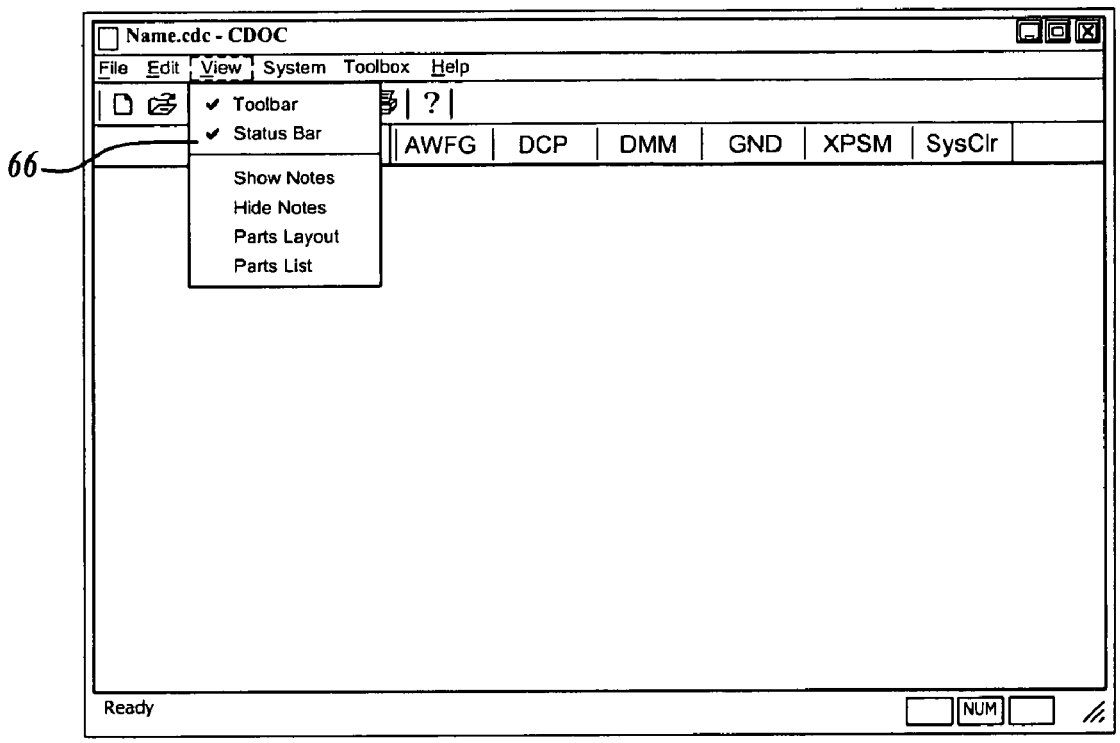
FIG. 8 illustrates a display screen shot showing view menu options in accordance with an embodiment of the present invention.

FIG. 8 illustrates the "view" menu 62, which allows the user to select active windows to be displayed. These include a second top toolbar 64, which provides shortcut button icons for executable functions such as new file/folder, open file/folder, save, cut, paste, print and about. Other custom shortcut buttons may be added. A status bar 66 can be selected from the view menu, and provides information including graphical information on the status of each instrument. For example, the status bar 66 may list each instrument as having a condition such as "idle," meaning the instrument is not receiving or sending data, "no response," meaning that the instrument is nonresponsive, or "active," meaning that the instrument is receiving and/or sending data. The instrument status may be further indicated by color coding, such as a green background to indicate the instrument is healthy (and either active or idle), a yellow background to indicate that an error code is sensed and the instrument may need to be serviced, or a red background to indicate that the instrument is not responding or some other error code is preventing the instrument from functioning. The status bar 66 is an optional feature that may be used instead of or in addition to color coding the individual instrument icons 40. A notes feature can be selected from the view menu to show or hide the previously described note boxes. A parts layout feature can be selected from the view menu to allow display of the parts layout for a UUT in an active window. When the parts layout feature is selected, an active dialog window opens allowing the user to select a desired stored layout to view, or to enable the user to import a layout diagram, such as a scanned image. A parts list feature can be selected from the view menu to allow the display of a CCU parts list in an active window, chosen using a dialog window from stored parts lists, or to import a new parts list.

Figure 9:
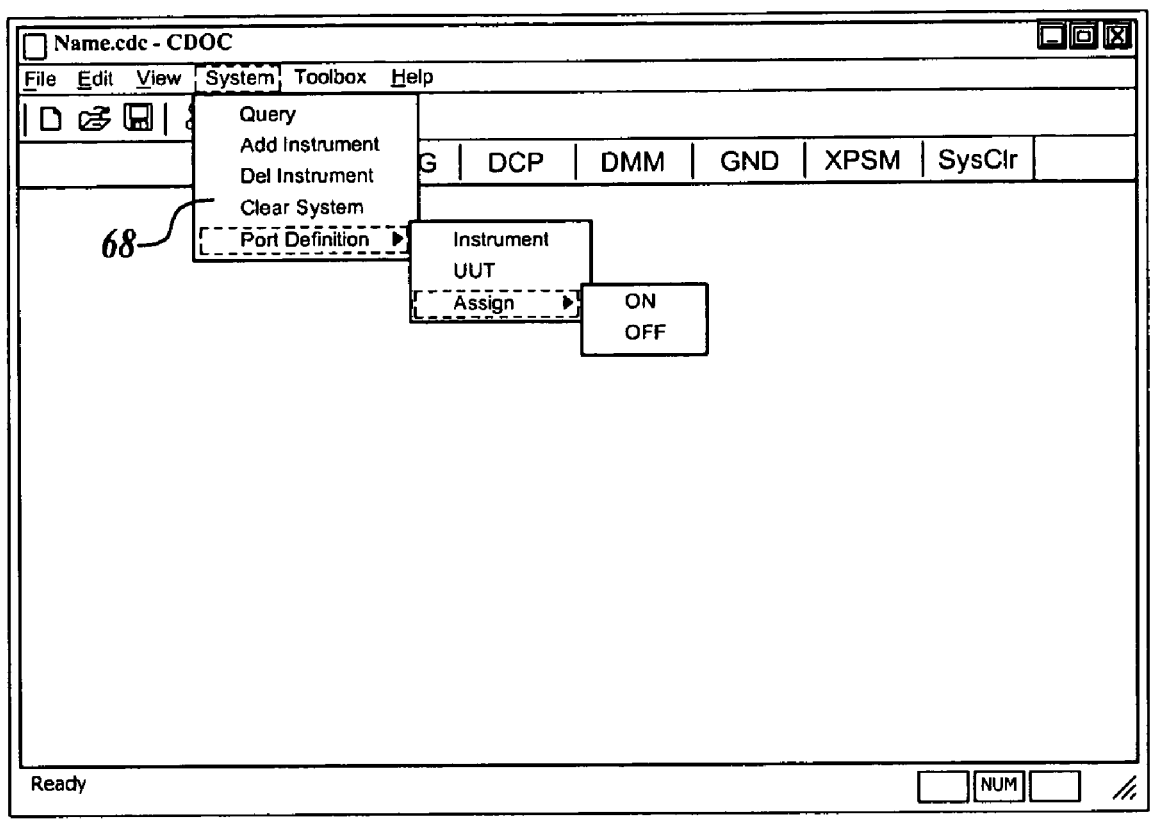
FIG. 9 illustrates a display screen shot showing system menu options in accordance with an embodiment of the present invention.
Figure 10:
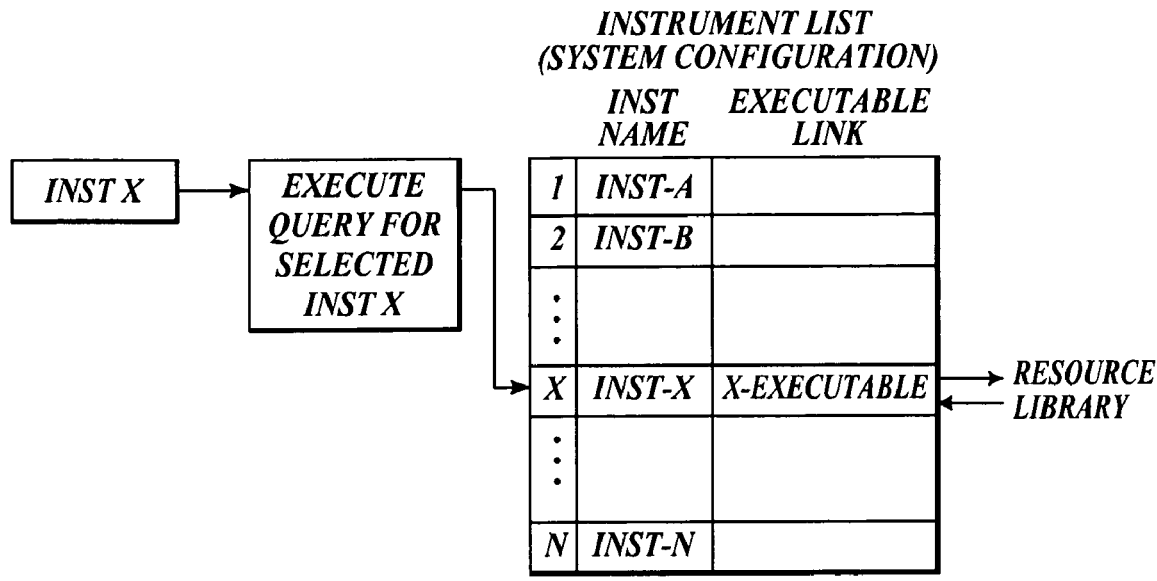
FIG. 10 illustrates the building of a system configuration spreadsheet in accordance with an embodiment of the present invention.

FIG. 9 illustrates the "system" menu 68, accessible from the top toolbar 34, which provides routines for configuring the system in accordance with a preferred embodiment of the invention. The "query" feature can be selected on the system menu to display a list of available instruments 12 from the system configuration spreadsheet. The instruments listed will match the instrument icons appearing on the virtual work environment 32. The query feature can be selected to query all instruments, which routes executables to the hello file to query each instrument listed in the system configuration. Alternately, an individual instrument 12 can be selected and individually queried as shown in FIG. 10.

The "add/delete" instrument feature can be selected from the system menu 68 to add or remove instruments from the system configuration spreadsheet. Selecting this feature results in a display of all potential test instruments included in the resource library. Instruments on the list can be checked to add or unchecked to remove, followed by selection of "configure system" to update the active resources and revise the system configuration spreadsheet to include links to corresponding instrument executables. This routine suitably causes warnings to be displayed if an instrument 12 to be added or removed as an active instrument of the system configuration spreadsheet is currently in use.

Figure 11:
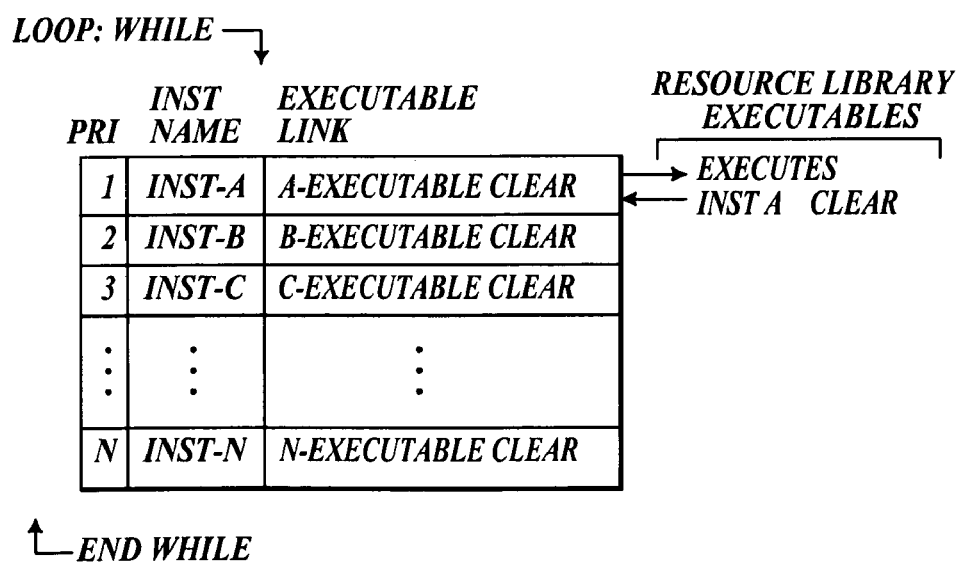
FIG. 11 illustrates a routine for clearing test instruments from the system configuration spreadsheet in accordance with an embodiment of the present invention.

The "clear system" feature can be selected from the "system" menu 68 to reset an individual instrument 12 back to initial settings, or to similarly clear all instruments 12. A clear system submenu will then be displayed, listing each individual instrument 12, a clear all command, and a prioritize command. Selecting an individual instrument from this submenu will result in the execution of a linked clear instrument executable for that instrument from the resource library. Selecting "clear all" instruments results in all instruments being cleared sequentially in a predetermined order, as illustrated in FIG. 11. Instruments are prioritized for clearing, from first to last, in either the order of addition to the system configuration spreadsheet, or as custom prioritized. As each instrument 12 is reached in the prioritized listing, a linked clear executable in the resource library is executed. The "prioritize" feature can be selected from the "clear system" submenu to change the order in which the instruments 12 are listed and cleared. When the prioritize feature is selected, an active window is opened that allows the instruments 12 to be prioritized by assigning each a number from 1 (for the first to clear) to n (for the last to clear of n total instruments). When prioritization is set as desired, the user can select a "change" function, and the instruments in the system configuration spreadsheet are reordered accordingly. Subsequently selecting "clear all" on the clear system submenu will then result in clearing each instrument in this new order.

Figure 12:
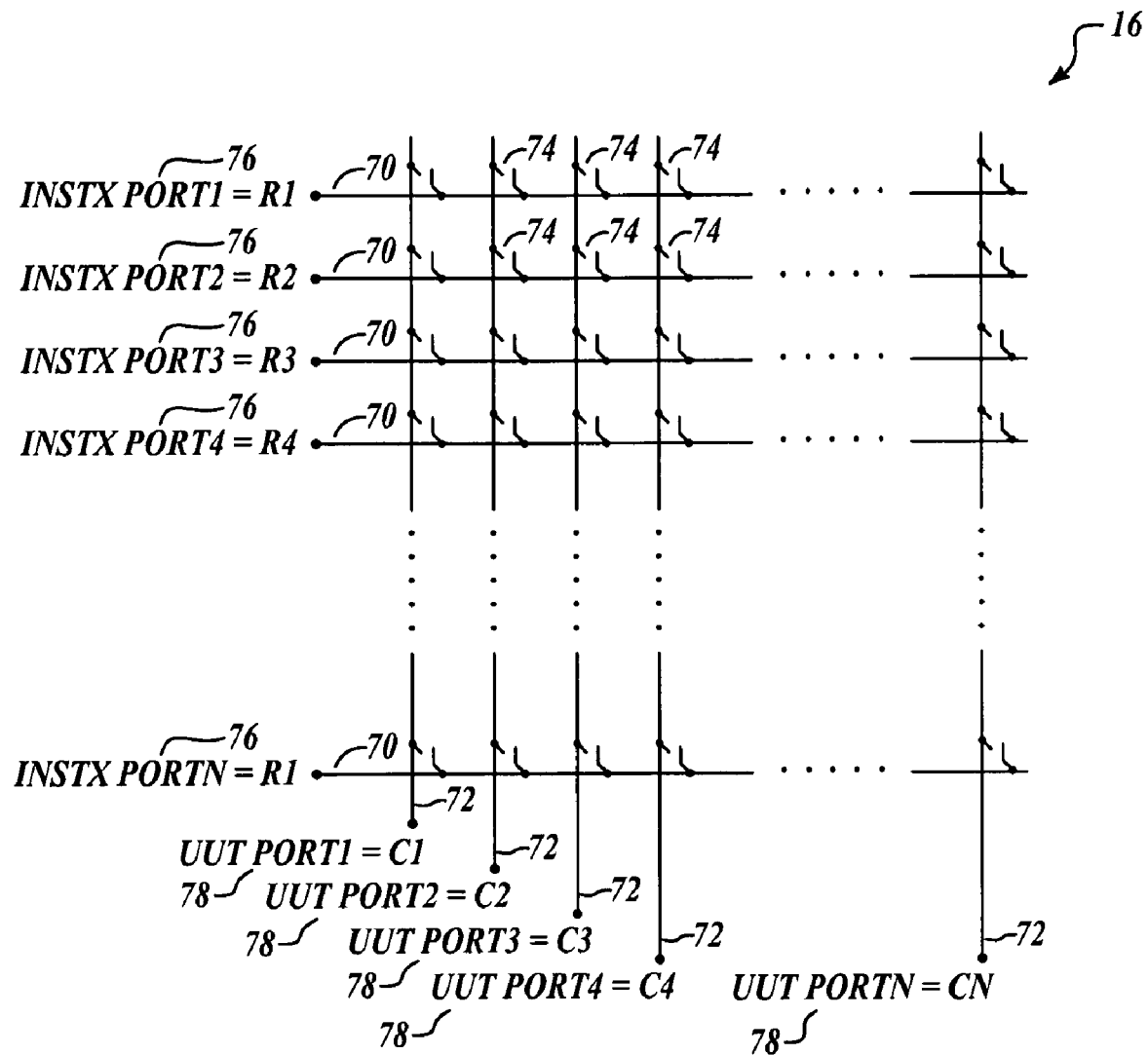
FIG. 12 illustrates a switch matrix connecting test instrument ports to circuit ports in accordance with an embodiment of the present invention.

The "port definitions" feature on the system menu 68 defines the physical (electrical) connections between signal ports of the test instruments 12 and the UUT to the switch matrix 16 with respect to the instrument and UUT ports displayed on the graphical display 18. When so defined, each instrument port will provide the first half of the call name for a switch included within the switch matrix, and each UUT port will provide the last half of the call name of the switch. FIG. 12 illustrates an example of port definition and corresponding switch activation. The switch matrix 16 includes a plurality of first busses, indicated in FIG. 12 as rows 70 that cross a plurality of second busses, indicated in FIG. 12 as columns 72. The intersection of each row 70 with a column 72 is connected by a switch 74. The $1^{st}$ through Nth rows 70 (labeled RI through RN in FIG. 12) are connected to the $1^{st}$ through Nth instrument ports 76. The $1^{st}$ through Nth columns 72 (labeled C1 through CN in FIG. 12) are connected to 1st through Nth UUT ports 78. It will be apparent to those of ordinary skill in the art that while FIG. 12 illustrates instrument ports 76 as being associated with rows of the switch matrix 16, and UUT ports 78 as being associated with columns of the switch matrix 16, the converse is also within the scope of the present invention, as is the use of a multipoint switch matrix configured other than as an array.

The system menu 68 allows the user to correlate displayed virtual instrument ports to physical instrument ports. To define the instrument ports, the user selects "port definitions"—"instrument" from the system menu. The user then enters the number of switch matrix rows (N) into an active window. FIG. 13 illustrates the instrument port spreadsheet that is then displayed, which lists each instrument port. Assuming no prior definitions, the rows assigned to each instrument port are blank. The user then types in the row (R1, R2, etc.) of the switch matrix to which the instrument port is physically connected. Through this definition process each instrument port name is associated with a physical system connection. The user may also enter the nature of the signal transmitted through the port (input, output or bidirectional), and the usage and conditional status of the port. For example, referring to FIG. 13, the first row (i.e., switch port, R1) is connected to the Xth port of instrument X which transmits an output signal, the second row R2 is connected to the Yth port of instrument X which transmits an input signal, while the Nth row RN is connected to the Mth port of instrument N and transmits a bidirectional signal. While the example of FIG. 13 lists the rows 70 in numerical order, this need not be the case. Not every row 70 must be assigned; the number of switch matrix rows 70 may exceed the number of instrument ports 76. The "account" feature (FIG. 13) of the instrument port spreadsheet keeps track of instrument port assignments so that no port can have more than one definition. The "conditional" feature (FIG. 13) tracks port assignments with respect to system condition and checks for unwanted conditions, e.g., an instrument output may be connected to a UUT input, but an instrument output may not be connected to a UUT output. During use of the system with multiple UUTs, the instrument port spreadsheet will typically remain constant unless instruments are added or deleted from the system.

The system menu 68 also allows the user to similarly define the UUT ports to correlate the virtual UUT connections with the physical UUT interface-to-switch matrix connections. The displayed UUT schematic is treated as an icon with assignable ports around its periphery. When the user selects "UUT port definitions" from the system menu 68, an active window requests entry of the total number of columns in the switch matrix, and the UUT port spreadsheet is then displayed as shown in the example of FIG. 14. The UUT port spreadsheet lists each column 72, while the UUT port names are blank unless previously assigned. The user then enters the name of the UUT port 78 to be connected to that column 72 of the switch matrix 16. The UUT port spreadsheet thus enables the user to associate a UUT port name with a physical system connection. Referring still to FIG. 14, the account feature ensures that no column is assigned twice, the signal feature identifies the nature of the signal transmitted through the UUT port, and conditionals are tracked to ensure nonpermitted connections are not made. The UUT port spreadsheet will typically change for each different type of CCA to be tested.

FIGS. 15 and 16 illustrate exemplary instrument port and UUT port spreadsheets, respectively, as displayed in an active window. It can be seen in FIG. 15 that instrument X port Hi is connected to switch matrix row 1, instrument X port Lo is connected to switch matrix row 2, etc. It can be seen in FIG. 16 that column 1 is connected to UUT port P1-A, column 2 is connected to UUT port P1-B, etc.

The instrument ports 76 and the UUT ports 78 defined in the instrument and UUT port spreadsheets are displayed graphically on the display 18. In a preferred embodiment, the UUT port 78 icons are arranged on the periphery of the displayed UUT schematic, while the instrument port 76 icons are arranged on the periphery of the displayed instrument 12 icons. Each displayed icon for a test instrument 12 contains features of the instrument including the signal ports. The instrument signal ports may be moved graphically about the periphery of the instrument icon by clicking and dragging on the port icon, for a less cluttered appearance as desired. The UUT ports need to be assigned to the UUT schematic image. To do this, the user selects "assign" from the system menu, "port definition" submenu, and then selects to turn this feature on. An active window (FIG. 17) will appear that lists each UUT port, suitably in terms of the assigned switch matrix column. A user can select (via a mouse click) the desire port and drag it to the periphery of the UUT schematic on the virtual work environment 32. This operation is repeated until all desired UUT port placements have been made. UUT ports may subsequently be moved to other locations on the schematic periphery. In one aspect of the invention, the graphical placement of UUT ports will coincide with the input or output leads displayed on the UUT schematic.

Figures 17, 18:
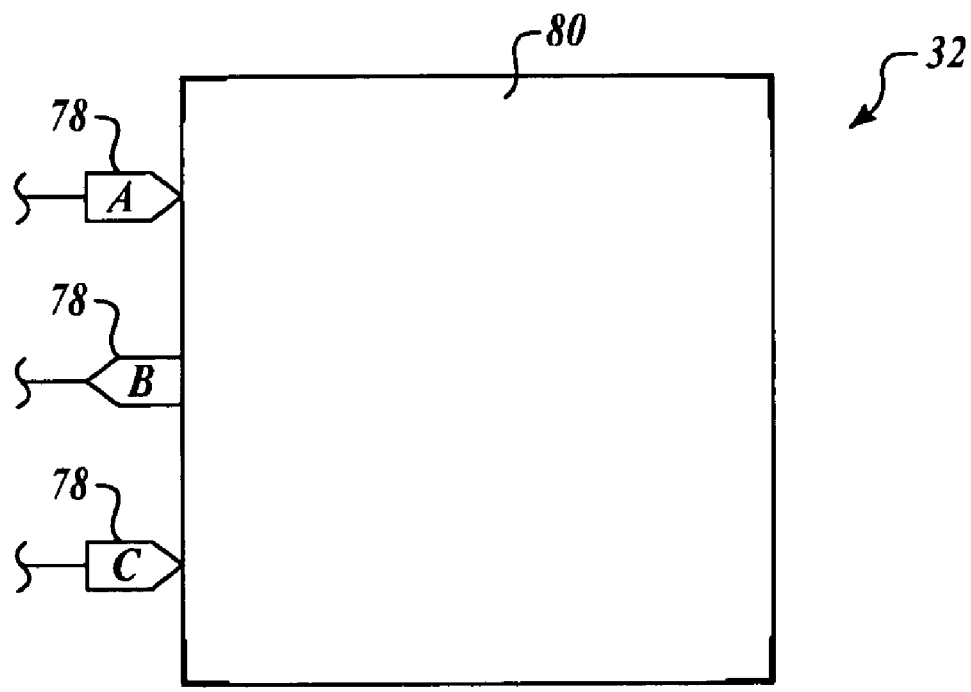
FIG. 17 illustrates a display screen active window listing UUT ports for placement of corresponding icons on the displayed circuit schematic in accordance with an embodiment of the present invention.
FIG. 18 illustrates a display screen image showing circuit port icons placed on the displayed circuit schematic in accordance with an embodiment of the present invention.

FIG. 18 illustrates the placement of three UUT ports 78 on the periphery of a UUT schematic 80, displayed on the virtual work environment 32, in this fashion. When the display cursor is placed over one of the UUT ports, the port placement routine will recognize this icon as a UUT port. Placed UUT ports may be removed from the periphery (by hovering, right clicking and deleting) or moved (by clicking and dragging) using conventional graphical user interface techniques. When all UUT ports are assigned and placed as desired, the "assign" feature is turned off.

Figures 19, 20:
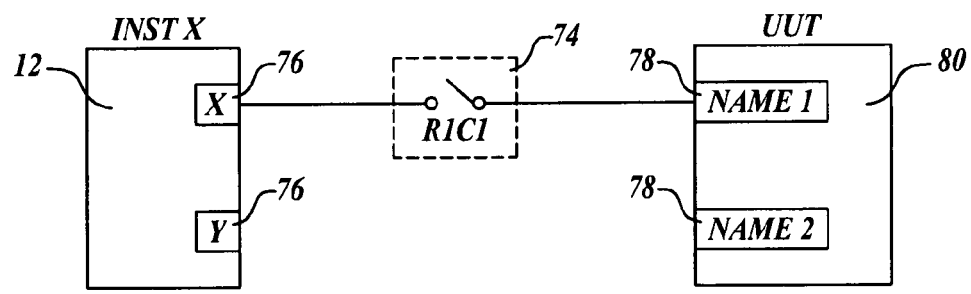
FIG. 19 provides a switch matrix configuration spreadsheet showing the connections between test instrument ports and circuit ports in accordance with an embodiment of the present invention.
FIG. 20 illustrates the graphical switched connection between an instrument port and a UUT port in accordance with an embodiment of the present invention.

Definition of the instrument port spreadsheet and the UUT port spreadsheet results in compilation of a switch matrix configuration spreadsheet, as shown in FIG. 19. The switch matrix configuration accounts for all of the switches 74, with the total number of switches 74 being equal to the total number of possible instrument ports (i.e., rows) multiplied by the total number of possible UUT ports (i.e., columns). Initially the switch matrix configuration spreadsheet lists (N rows times N columns) of switches, each with blank fields. The switch matrix configuration spreadsheet is populated and updated automatically after each instrument port spreadsheet or UUT port spreadsheet revision. Referring to FIG. 19, each switch 74 name is designated by a corresponding row and column (e.g., R1C1). For each switch 74, the spreadsheet indicates whether an instrument port has been allocated, whether a UUT port has been allocated, whether physical connections have been made, whether the switch is open or closed, and any conditionals.

Because the switch matrix 16 is arranged as an array, with each column crossing all rows, and each row crossing all columns, with a switch 74 being located at each juncture, it is possible to connect any UUT port 78 to any instrument port 76 (as limited by conditional rules). The physical connections of a given UUT port to a given instrument port are made in response to a graphical connection made by the user on the display 18. As noted above, each UUT port 78 and each instrument port 76 are graphically represented as icons on the display 18. Referring to FIG. 20, an instrument 12 icon includes instrument port 76 icons. A UUT schematic 80 includes UUT ports 78. Referring to the exemplary display window of FIG. 16, a user can (via mouse action) click on an instrument port 76 icon (instrument X, port X in the example) and drag a graphical line to the UUT port 78 icon (UUT port Name_1 in the example), releasing the mouse button at that point, to interconnect these ports via a switch (switch R1C1 in the example, as determined from the previously defined instrument port spreadsheet where instrument X, port X was assigned to row 1 of the switch matrix, and the UUT port spreadsheet where UUT port Name_1 was assigned to column 1). This action results in switch R1C1 being placed (activated) graphically on the display 18 between instrument port X,X and UUT port Name_1, where it is shown in green in the open condition. The switch R1C1 may be toggled between the open and closed configuration on the graphical interface 18, resulting in the corresponding physical switch being opened or closed. The interconnection between these ports may be deleted by selecting the graphical connection line and deleting this.

Figure 21:
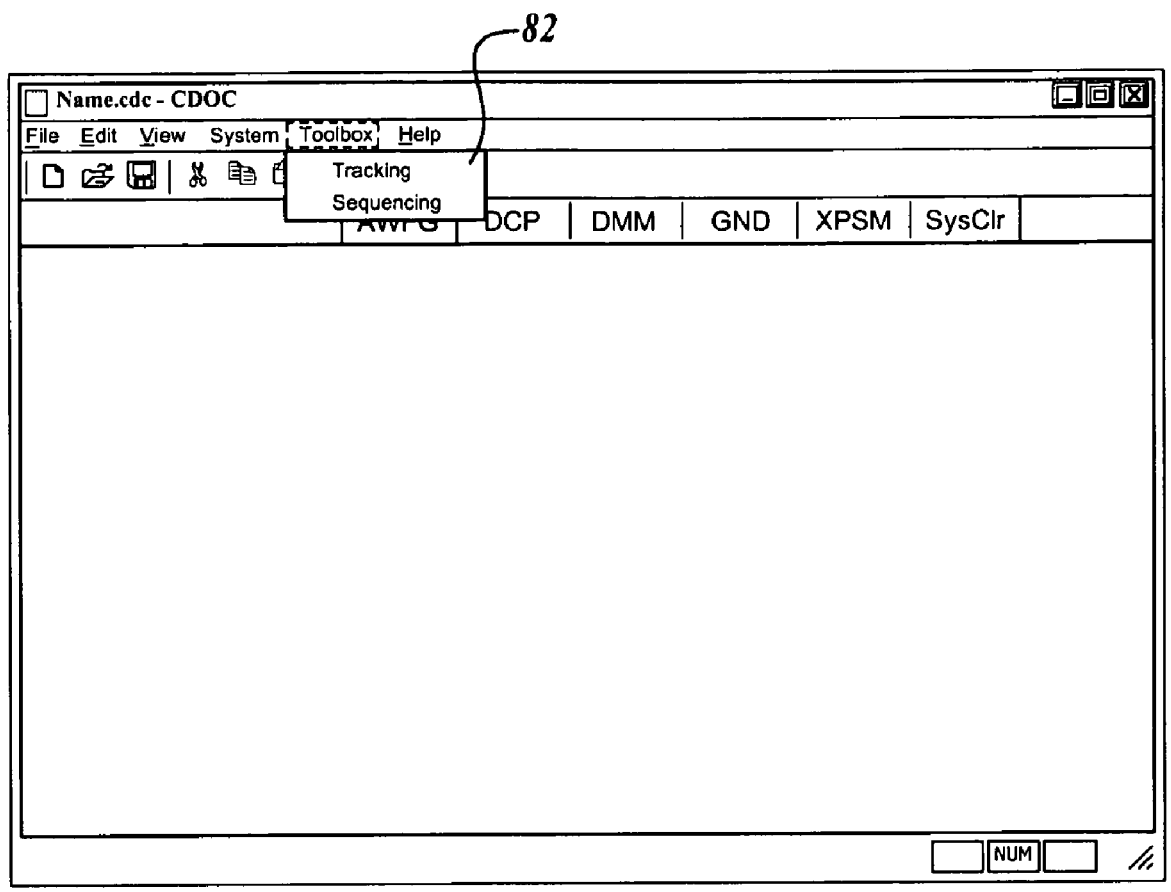
FIG. 21 illustrates a display screen shot showing toolbox menu options in accordance with an embodiment of the present invention.
Figure 22:
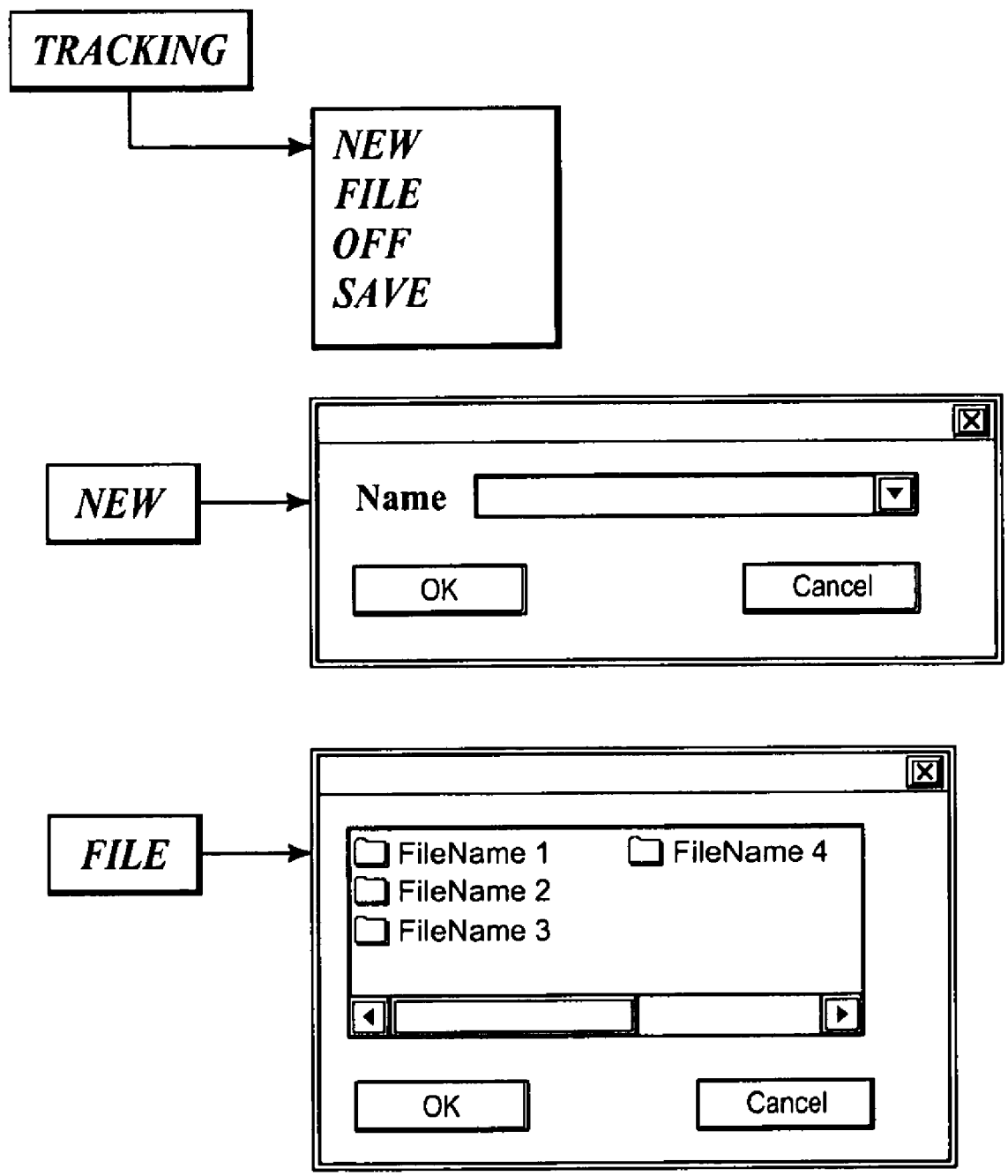
FIG. 22 illustrates display screen active windows for tracking and saving port connection and test function sequences in accordance with an embodiment of the present invention.
Figure 23:
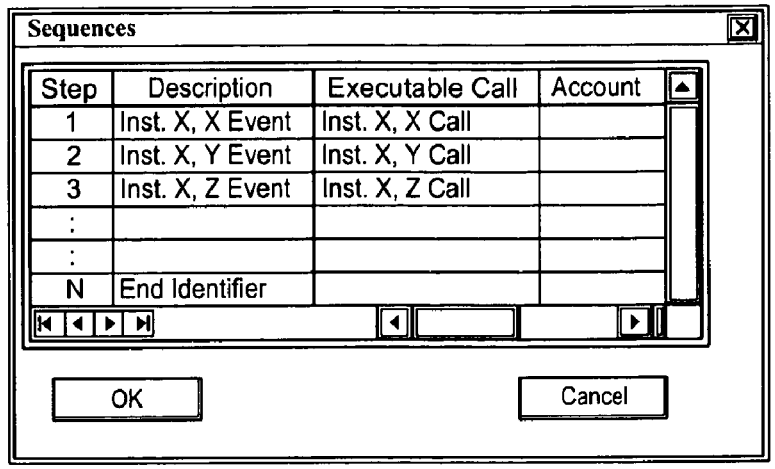
FIG. 23 illustrates a display screen shot showing a saved action sequence for testing of a circuit in accordance with an embodiment of the present invention.
Figure 24:
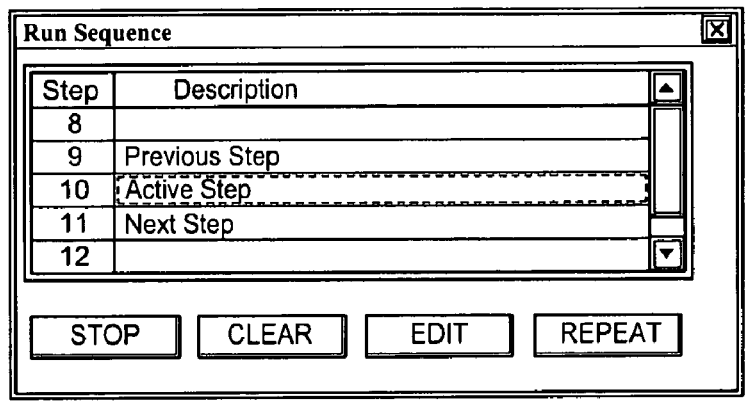
FIG. 24 illustrates a display screen shot during performance of a saved action sequence for testing of a circuit in accordance with an embodiment of the present invention.
Figure 25:
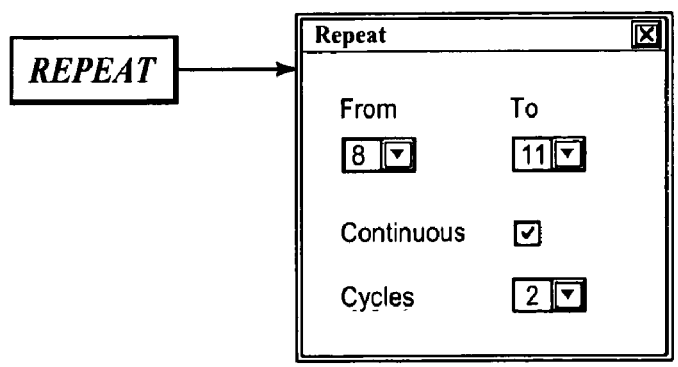
FIG. 25 illustrates a display screen shot showing the ability to repeat a saved action sequence for testing of a circuit in accordance with an embodiment of the present invention.

FIG. 21 illustrates the "toolbox" menu 82, which allows the user to select active windows for tracking and sequencing user actions in configuring port assignments and performing test functions. The tracking feature records each graphical event performed by the user, including port connections and test functions, and saves this tracked sequence as an automatic or semi-automatic test set-up and/or test. Referring to FIG. 22, selection of "tracking" from the toolbox menu results in the user being prompted to either select a previous tracking file or create a new tracking file. A name can be entered for a new file, or saved files can be selected from a displayed list. The routine then continues on, and FIG. 23 illustrates a saved sequence of events with linked executable calls, each step being numbered in numerical order. The user can select to "run" this saved sequence stepwise from beginning to end, so that the user can monitor progress and results of each step. An active window will be displayed, as shown in FIG. 24, as the system steps through the saved sequence, with the current step in progress highlighted at the center of the window. Running of the sequence can be halted at any desired point by selecting "stop." When halted, a scroll bar can be used to a different point in the sequence, and running may then be resumed. The user may select a "repeat" feature, as shown in FIG. 25, to enable any subset of steps (as noted numerically) to be repeated any specified number of times or continuously until stopped. The saved sequence may be edited by selecting "edit," to remove steps or to add steps either graphically or manually such as by typing in commands or choosing test functions from a list of valid events. When a preset valid event in inserted, the user may also enter a description, and the event executable and step description are then inserted into the saved sequence. The saved sequence may be cleared by selecting "clear."

Figure 26:
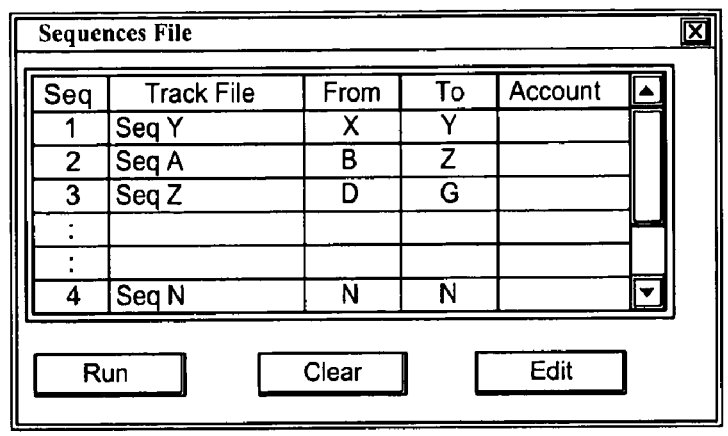
FIG. 26 illustrates a display screen shot showing the ability to chain together saved action sequences for testing of a circuit in accordance with an embodiment of the present invention.
Figure 27:
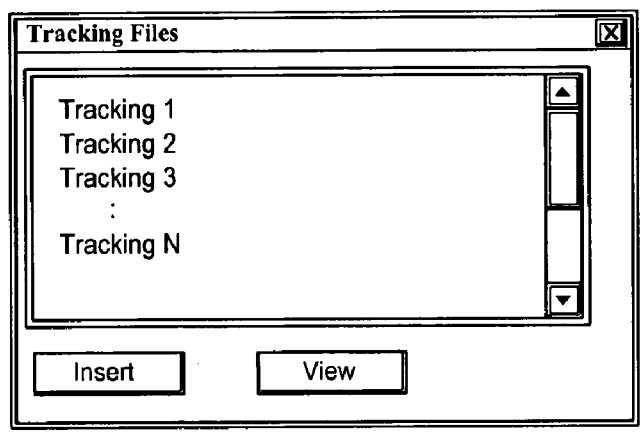
FIG. 27 illustrates a display screen shot showing the ability to select from saved action sequences for testing of a circuit in accordance with an embodiment of the present invention.
Figure 28:
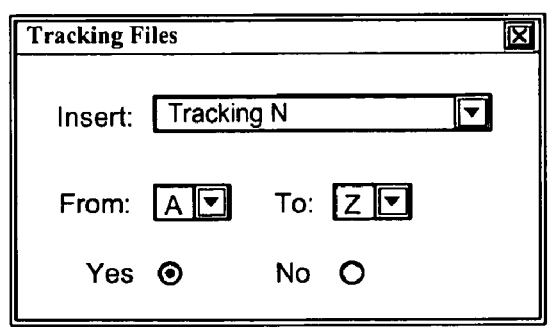
FIG. 28 illustrates a display screen shot showing the ability to edit assembled action sequences for testing of a circuit in accordance with an embodiment of the present invention.

The "sequencing" feature on the toolbox menu 82 enables the user to chain together multiple saved tracking files and/or individual step sequences within a saved tracking file, to create a more complex chain of events such as an automated test sequence. When sequencing is selected, the user will be prompted to either create a new sequencing file or to select from previously saved sequencing files. FIG. 26 illustrates a saved sequencing file. Multiple saved tracking files are listed and numbered in numerical order. For each sequenced tracking file, the name of the tracking file and the range of steps in the tracking file to be performed are listed. "Run" can be selected to have the system execute the indicated steps of the saved tracking files in the order listed. The active tracking file is highlighted in the center of the saved sequence. The sequence can be interrupted by selecting "stop," the sequence can be cleared, and the sequence can be edited to allow the inclusion of additional tracking files or steps of a tracking file (selected from a list of valid tracking files as shown in FIGS. 27 and 28), remove tracking files, or change the indicated range of steps from the tracking file to be performed.

2. Configuring the System

Figure 29:
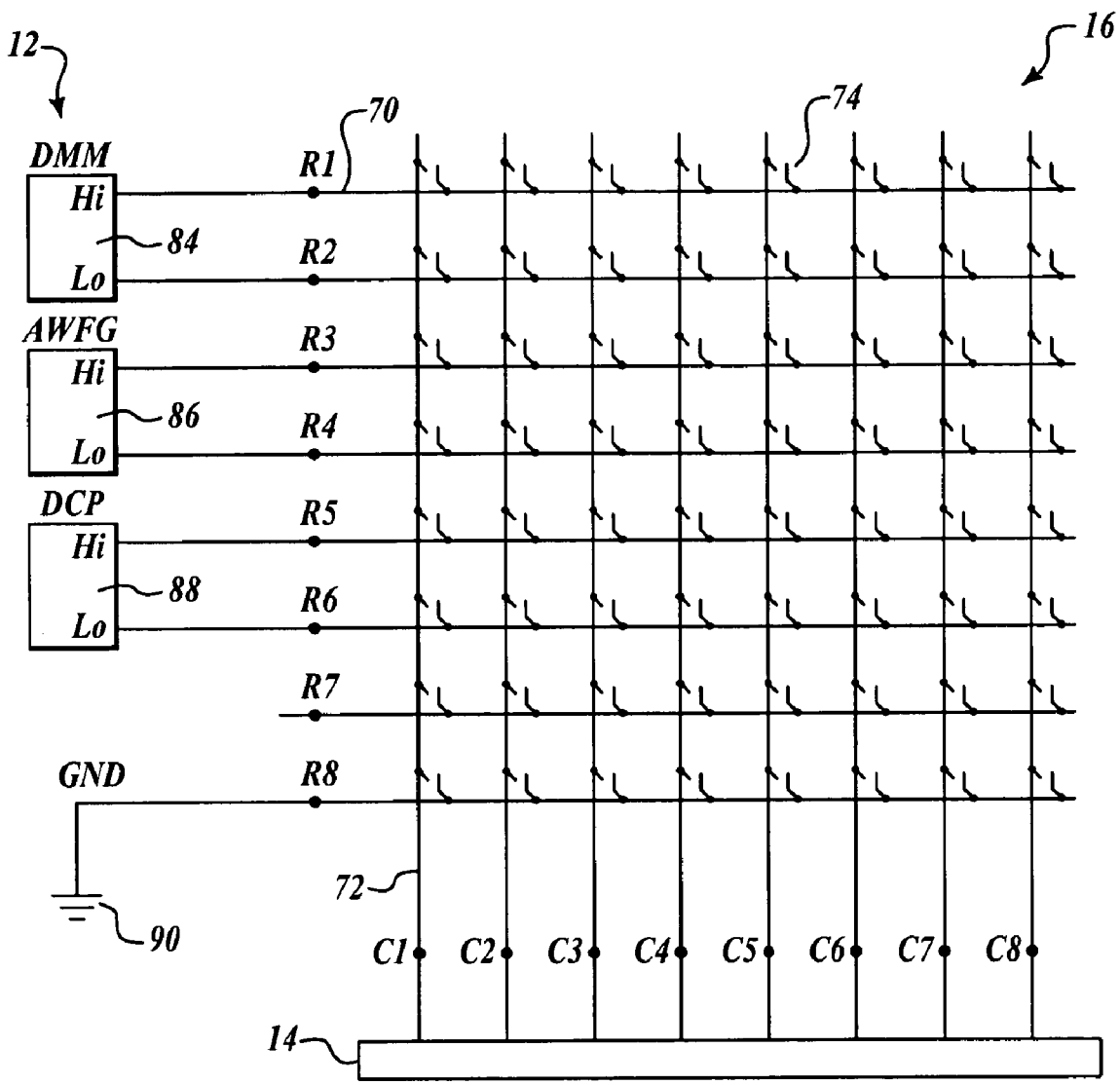
FIG. 29 illustrates an exemplary connection of a switch matrix to test instruments and a circuit interface for an embodiment of a diagnostic system in accordance with the present invention.
Figure 30:
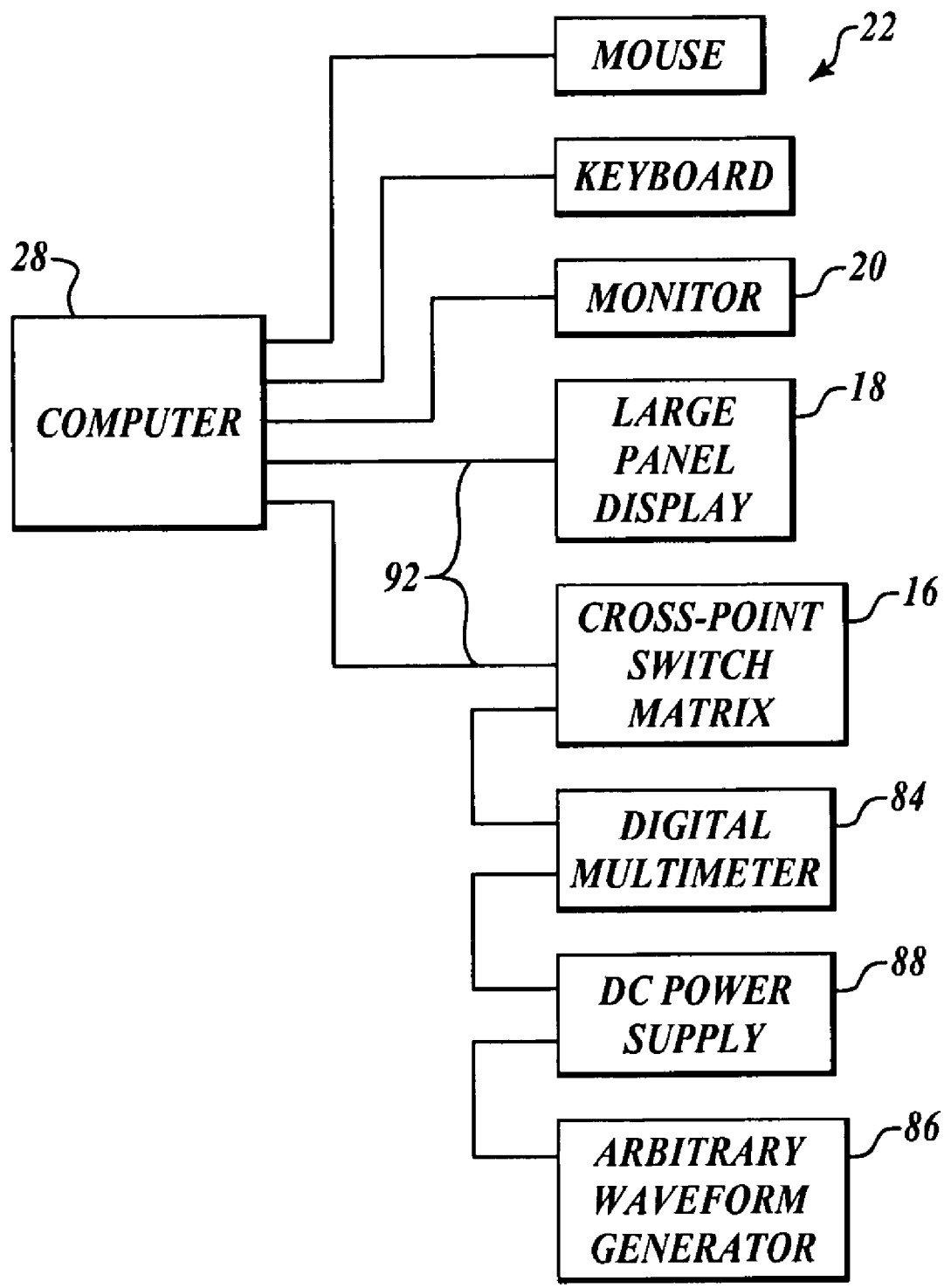
FIG. 30 illustrates an exemplary connection of test system hardware components for the embodiment of FIG. 29.

The process of initially configuring the test system of the present invention may be best understood by way of an example. FIG. 29 includes an exemplary 8×8 cross-point switch matrix (XPSM) 16 having the first six rows (R1-R6) connected to the high and low signal ports of a digital multimeter (DMM) 84, a programmable arbitrary waveform generator (AWFG) 86 and a programmable DC voltage source (DCP) 88, one row (R7) unused and the last row (R8) connected to ground 90. It will be apparent to those of ordinary skill in the art that alternate or additional test instruments and alternate switch matrixes may be utilized, and that the hardware described is for purposes of illustration only. The columns (C1-C8) are connected to the electro-mechanical UUT interface 14. The cross-point switch matrix 16 communicates with the DMM 84, DCP 88, AWFG 86, computer 28, graphical display 18, secondary display 20 and mouse and keyboard (input devices 22) via a communications bus 92 as shown in FIG. 30.

Figure 32:
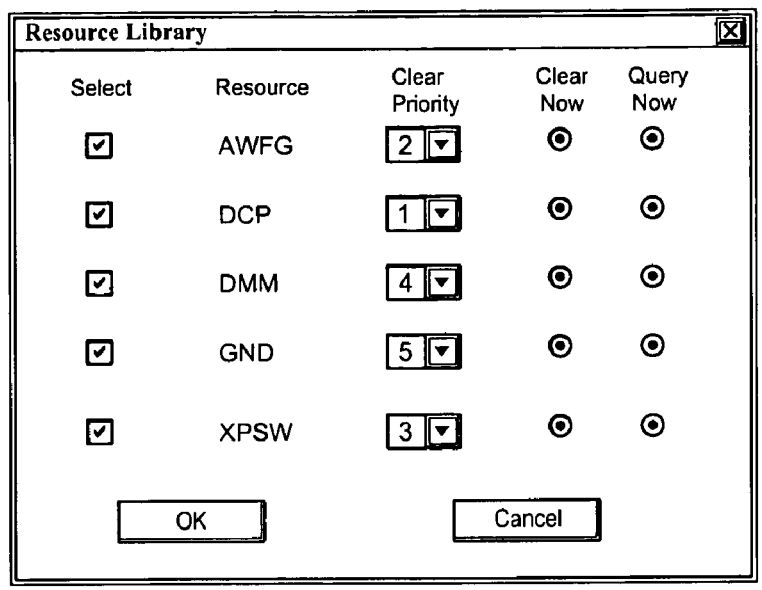
FIG. 32 illustrates a display screen active window allowing instrument configuration for the embodiment of FIG. 29.
Figure 33:
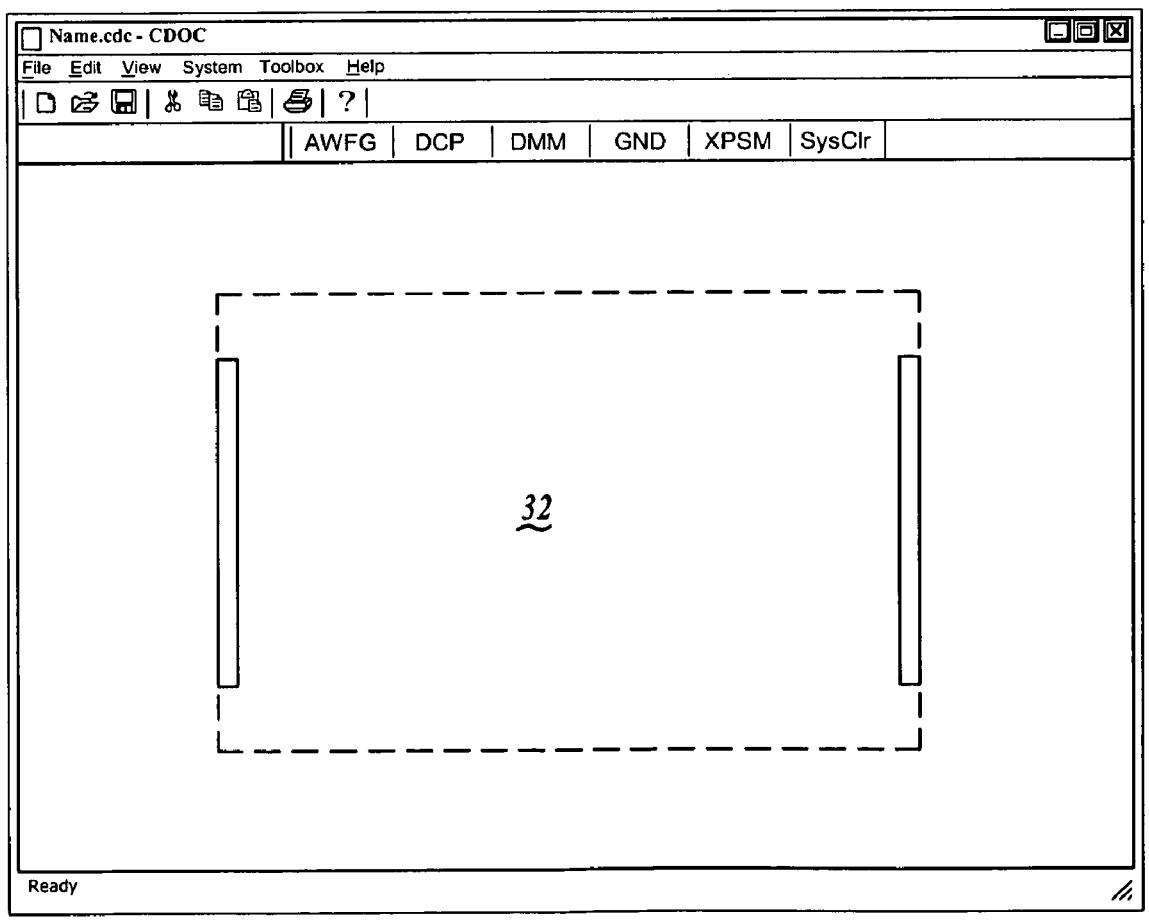
FIG. 33 illustrates a display screen shot showing the virtual work environment for the embodiment of FIG. 29.

To initially launch the application software of the present invention, the resource library must be populated with test instrument executables, as illustrated in the exemplary resource library of FIG. 31. The hello window then appears. Selecting "continue" allows the program to continue the application launch sequence. The system does not know that there are any available instruments at this time because they have not yet been added to the system configuration spreadsheet. Because there are no instruments recognized to query, a startup routine executes and recognizes that the system configuration is vacant. A window will be displayed to allow the operator to configure the system instrumentation. Selecting "yes" to configure the system invokes a build system configuration routine, which lists the available test resources to add from the system by selecting a box adjacent to the instrument description, as shown in FIG. 32. The resources (test instruments) are listed in alphabetical order, and the initial priority order in which to clear the instruments is sequential. The resource clear order may be changed to allow for sequential clearing in a different order, as shown in FIG. 32. After selecting the desired instruments, selecting "configure system" completes and saves the system configuration build actions. Each instrument is queried and a response is solicited, resulting in the generation and display of the virtual work environment 32 as shown in FIG. 33.

Figure 34:
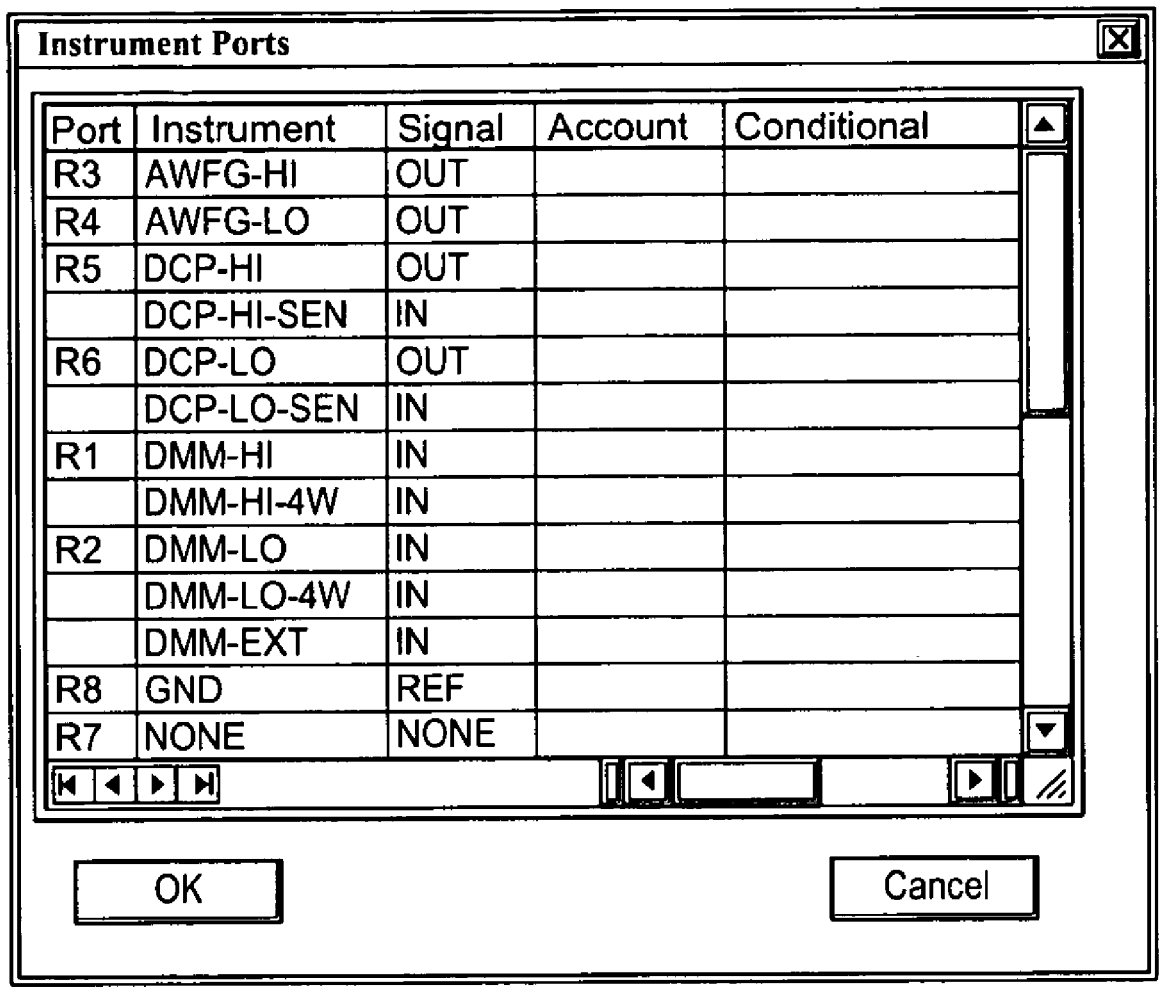
FIG. 34 illustrates a display screen shot showing the instrument port spreadsheet for the embodiment of FIG. 29.

Next the instrument port definitions are defined to correlate the virtual connections with the physical connections, in the manner described above, from the system pull down menu, port definition submenu, by selecting "instrument." The user enters the number of switch matrix rows (eight in this example) in response to a query, resulting in the instrument port spreadsheet being displayed as shown in FIG. 34. The spreadsheet of FIG. 34 initially includes a description of all of the instrument ports. The switch matrix rows are blank and must be completed by the user by entering the switch matrix row ports to which the instrument signal ports are physically connected. In this example, R3 is assigned to AWFG-HI, R4 to AWFG-LO, R5 to DCP-HI, R6 to DCP-LO, R1 to DMM-HI, R2 to DMM-LO, R8 to ground and R7 is left unused.

Other available instrument ports are not connected. The system is now configured and ready for configuration to test a specific CCA.

3. Use of the System

The present invention maybe better understood in view of examples of its implementation to test specific circuit card assemblies.

EXAMPLE I

Using the exemplary system as configured in FIGS. 33 and 34, a user can initiate testing of a CCA. To create the new test environment, the operator selects "new" from the file menu. A window appears that asks the operator to name the new test environment, such as "UUT_1" by way of example. After entering in this name, the user selects "create" and a test environment directory is created that will eventually contain a UUT port spreadsheet (e.g., UUT_1.DIR), a matrix configuration spreadsheet and a schematic file, and may optionally include other files such as a parts list, a layout, and saved test sequences.

Figures 35, 36:
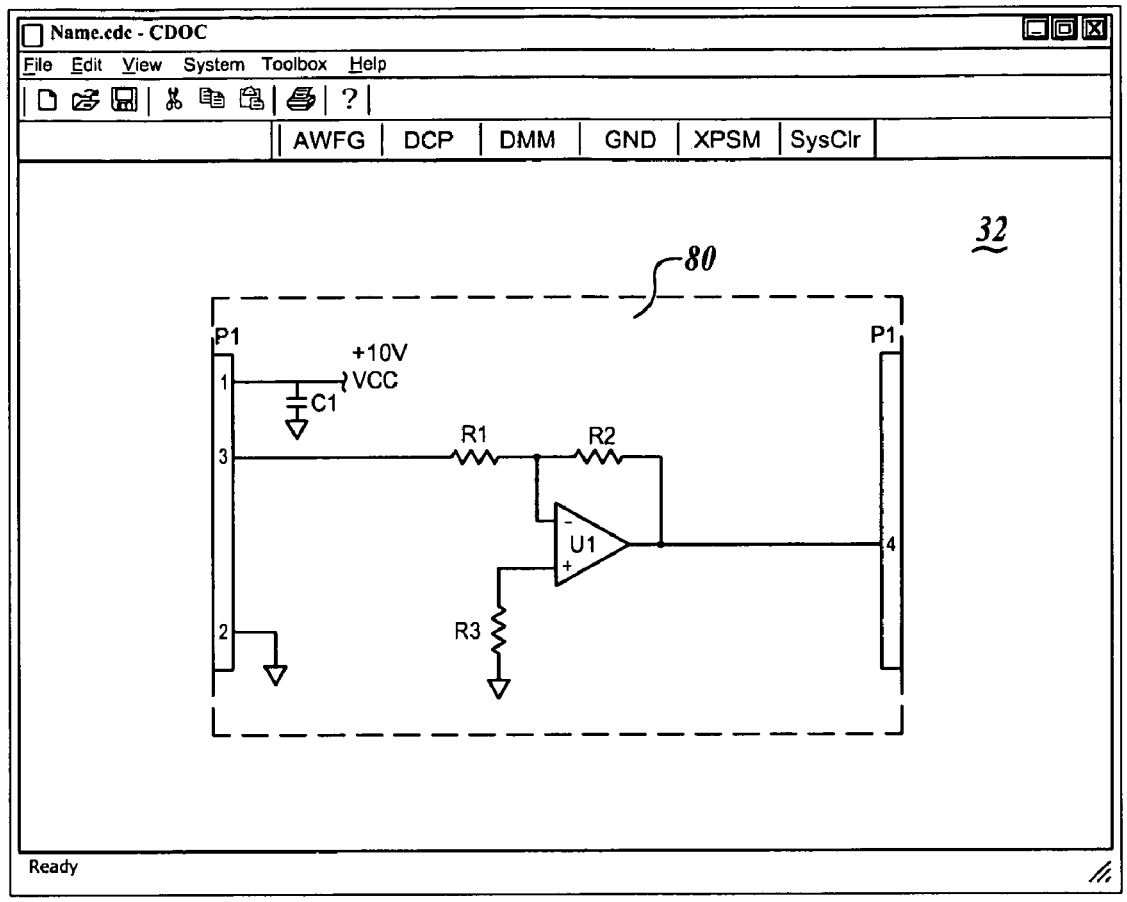
FIG. 35 illustrates a display screen shot showing a virtual work environment including an exemplary circuit schematic image and exemplary test instrument icons for an embodiment of the present invention.
FIG. 36 illustrates a display screen shot showing the circuit (UUT) ports spreadsheet in accordance with the embodiment of FIG. 35.

The circuit schematic for the CCA to be tested, i.e., the UUT schematic, is then imported via the file menu, import submenu, selecting for purposes of example to import a dumb schematic. A window is displayed that allows selection of files that contain schematic information (previously scanned in and stored such as in a .BMP, .JPEG or .TFF format) for conversion and placement in the blank virtual work environment 32. The desired schematic file (e.g., schematic_N) is selected, and the "import" option is then selected. A window is then displayed that will prompt for a converted file name, e.g., UUT_1 and location, e.g., directory UUT_1. Option "continue" is them selected and the file information from the original schematic file is converted and stored under the designated name in the designated directory. After conversion is complete, the schematic 80 is displayed in the work environment 32, as shown in the example of FIG. 35.

The physical layout and parts list for the CCA may also be imported, and may be useful during repair of the UUT. The process for importing the physical layout, accessible from the file menu, import submenu, "layout dumb" (for this example), is similar to the schematic layout importation. The layout is converted and saved under an assigned name (e.g., UUT_1) in the designated directory (e.g., UUT_1). To open and display the layout file, the user may be prompted to select whether the layout should be displayed on the primary graphical display 18 or the secondary display 20. The parts list can be imported and displayed in the same fashion as the layout. If the layout and parts list are imported, then for the example the UUT_1.DIR directory will include a UUT_1.LAY (layout), UUT_1.LST (parts list) and UUT_1.SCH (schematic).

After the importation of the schematic, and optionally the layout and/or parts list, the UUT ports are be defined to let the system know where each UUT port is physically connected. This is done through the system menu, port definition submenu, "UUT" option. The operator enters the number of switch matrix columns (eight in the present example), and the UUT port spreadsheet is created and displayed as shown in FIG. 36. The switch matrix columns are listed but the UUT port descriptions are blank. The user enter the names of the UUT ports that are physically connected via the UUT interface to the corresponding switch matrix columns, and optionally the type of signal for each. The operator then selects "update" to update the UUT port schematic, which results in a check for duplicate names and error conditions being carried out, provides warnings as may be appropriate, and saves the updated UUT port spreadsheet information. The system then builds the switch matrix configuration spreadsheet using the instrument port spreadsheet (as described above for configuring the system) and the UUT port spreadsheet. This action also defines the physical connection for the UUT interface 14 to the UUT connector. At this point in the process, the UUT_1.DIR directory will include UUT_1.LAY, UUT_1.LST, UUT_1.SCH, UUT_1.PTS (UUT port spreadsheet) and UUT_1.XMC (UUT switch matrix configuration spreadsheet).

Next, the UUT port assignments are placed on the virtual work environment 32 to provide the graphical representation of the physical points to be connected together via the switch matrix 16. This is carried out via the system menu, port definition and assignment submenus, option "on." A window appears that allows selection of a specific UUT port for placement onto the UUT schematic icon 80. In the list appearing in this window, UUT ports already placed may be designated in a different color or shading than ports not yet placed. Each desired UUT port name is selected by mouse click, and can then be dragged to the desired location on the displayed schematic periphery. The port icon will be automatically aligned on the periphery of the schematic image, and can later be repositioned if desired. Alternately, multiple UUT port icons may be selected and placed sequentially and in mass onto the schematic periphery by placing the screen cursor at the desired location, left-clicking to place the next sequential UUT port at that location, and repeating till all sequential UUT port icons have been placed in this fashion.

Figure 37:
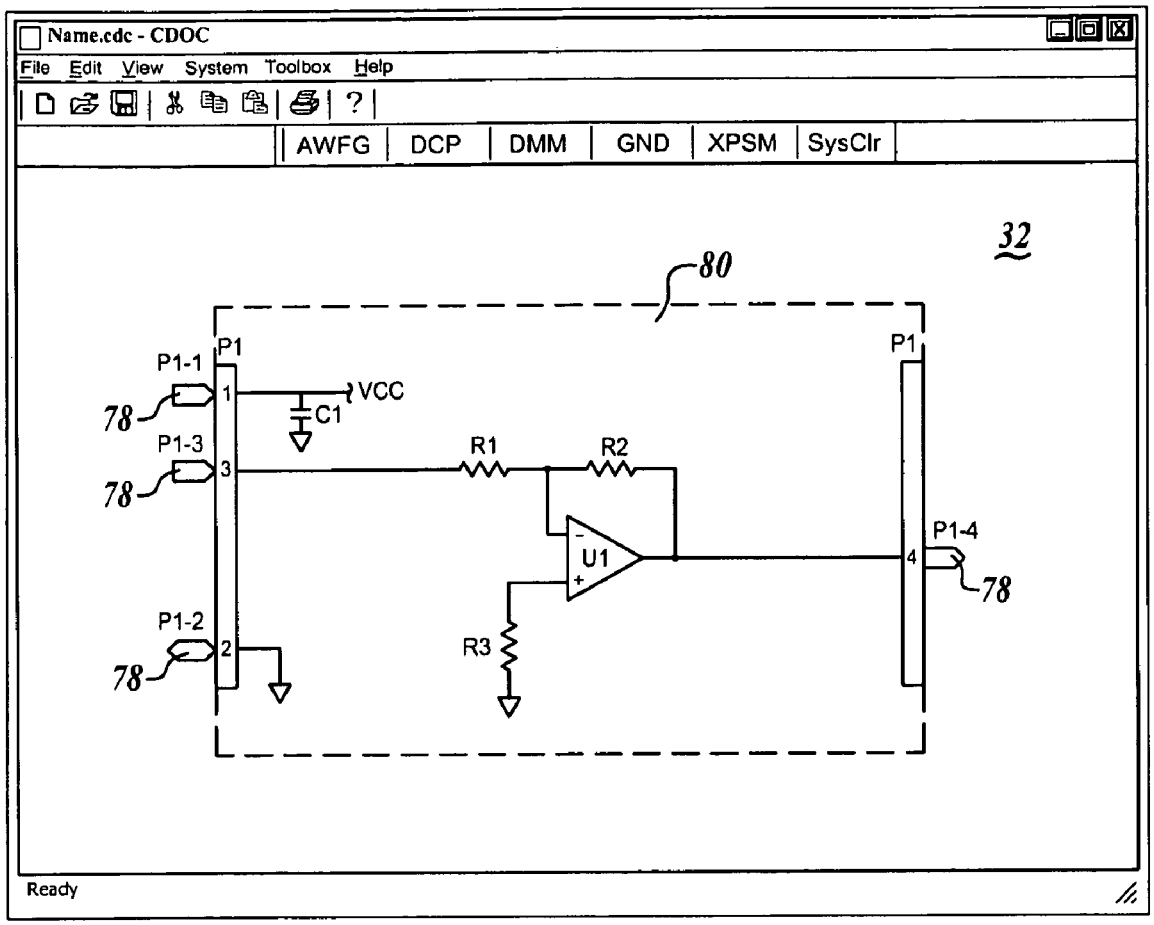
FIG. 37 illustrates a display screen shot showing the virtual work environment of FIG. 35 with graphical UUT port assignments having been made.

FIG. 37 illustrates the placement of four UUT ports 78, designated as P1-1, P1-2, P1-3 and P1-4, onto the periphery of the schematic 80 on the virtual work environment 32. The port definition assignment feature is then turned "off," the UUT port icons are repositioned on the schematic periphery as desired, and the UUT port configuration (including the UUT port schematic and the graphical location of the port icons) is saved.

The system is now ready to connect the instruments to the UUT via the switch matrix and to perform test functions. First, the tracking feature on the toolbox menu may be selected and turned on, to track the user's graphical operations. The tracking file name (e.g., UUT_1) is entered and "create" is selected. This action creates a spreadsheet that will log each operation that is graphically performed, with the spreadsheet listing the commands or actions being displayed in a tracking window. At this point, the UUT_1.DIR directory will include UUT_1.LAY, UUT_1.LST, UUT_1.SCH, UUT_1.PTS, UUT_1.XMC and UUT_1.TRK (the tracked sequence in progress).

Figure 38:
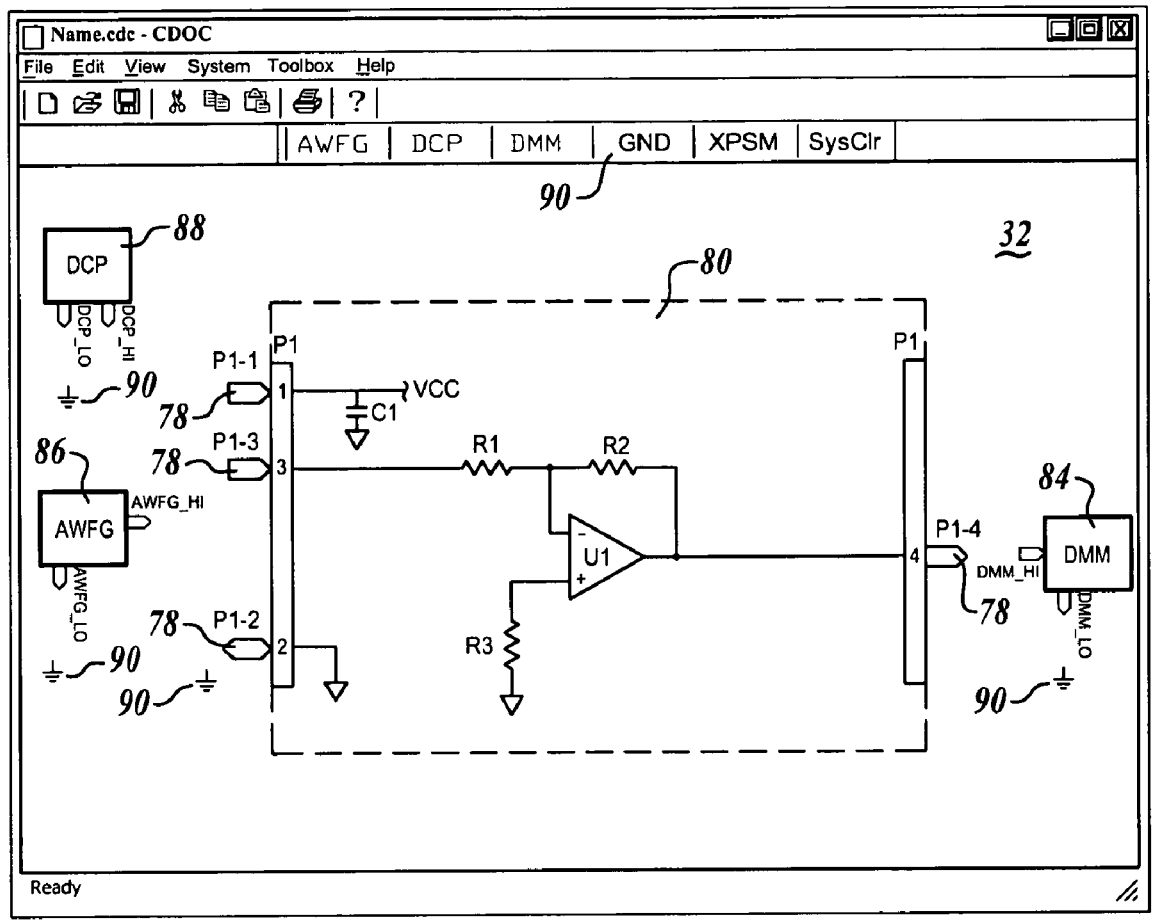
FIG. 38 illustrates a display screen shot showing the virtual work environment of FIG. 35 with graphical instrument icons having been placed by the displayed UUT schematic in preparation for connection.
Figure 39:
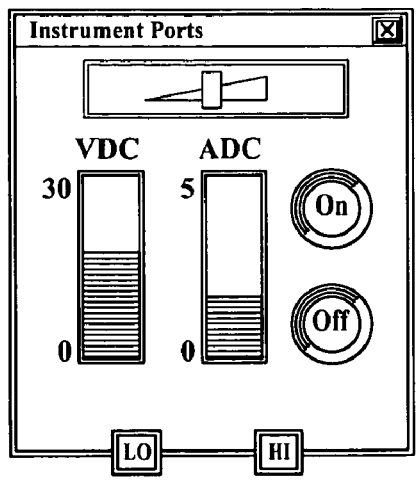
FIG. 39 illustrates a display screen icon providing for graphical operation of a test instrument in accordance with an embodiment of the present invention.

Test connections and functions can now be performed. For example, the power supply icon (DCP 88) can be selected from the area of the display below the top tool bar 34 and dragged to the desired screen location adjacent the UUT schematic 80, as shown in FIG. 38. The icon for DCP 88 may be enlarged by selecting the function on the icon. The enlarged icon contains embedded icons that correspond to the instrument controls and ports, as shown in the enlargement of FIG. 39. As described previously, the ports can be moved around on different locations on the periphery of the DCP 88 icon. The tracking feature tracks and stores the movement of the DCP 88 icon as an operation, and similarly would track and store the movement of ports of the DCP 88 icon. The icons for instruments AWFG 86 and DMM 84 are also repositioned as shown in FIG. 38. Each of these instrument icons also includes virtual controls and ports, and the movement of these icons is also tracked.

The ground 90 (or reference) icon is an example of a multiple point connection. Multiple copies of the ground 90 icon can be taken from the ground 90 "bucket" icon displayed below the top tool bar 34 and placed graphically on the virtual work environment 32 to represent this connection (FIG. 38). The physical reference will be established at the UUT ground reference. In this example, C2 becomes the ground reference plane as the switches are automatically assigned. The tracking feature logs the new screen positions of the multiple ground 90 icons.

Figure 40:
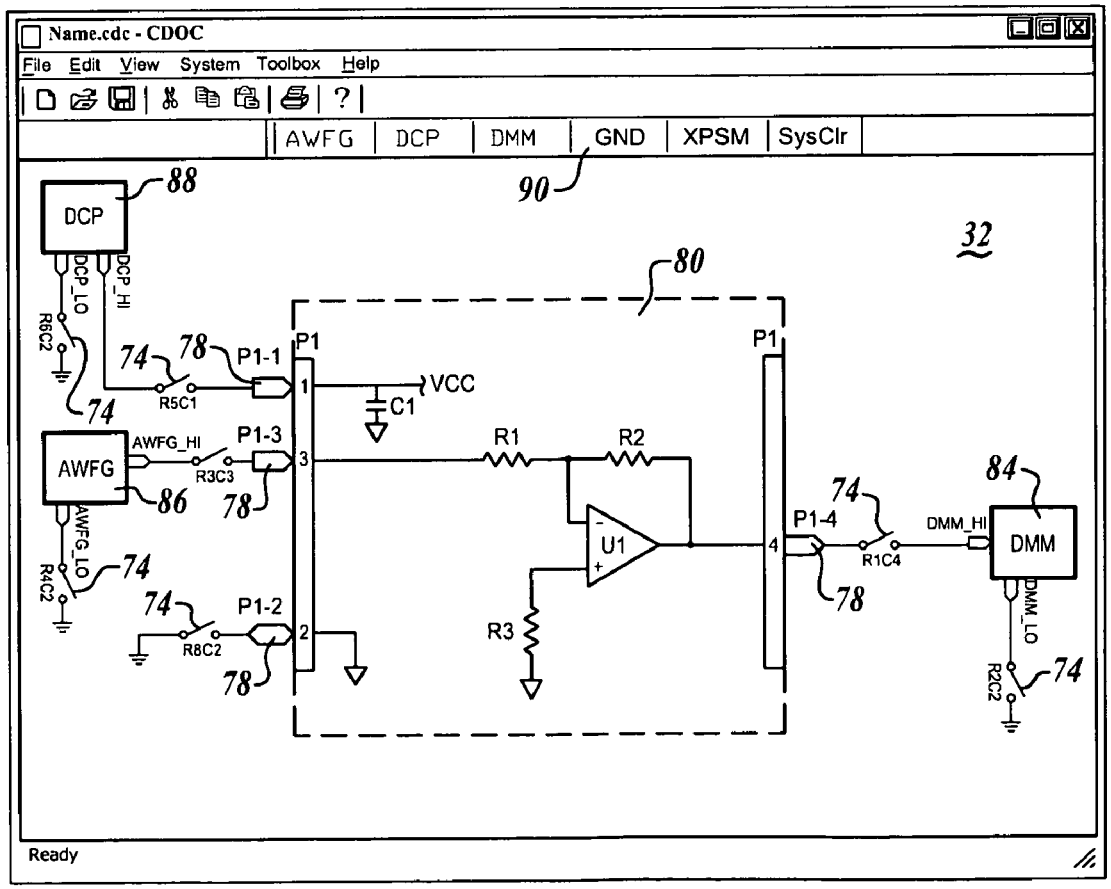
FIG. 40 illustrates a display screen shot showing the virtual work environment of FIG. 35 with graphical connections having been made between circuit (UUT) ports and instrument ports.

Now that UUT port icons have been placed and instrument port icons have been placed, the instrument ports are graphically connected to the UUT ports by drawing lines there between. Referring to FIG. 40, to connect the power supply port DCP_HI to the UUT port P1-1, for example, the cursor is placed over either port, the left mouse button is depressed and held down, and a line is "drawn" on the display be dragging the mouse till the cursor is positioned over the other port. In the illustrated case, a line has been drawn from DCP_HI to P1-1. This action causes a switch (R5C1, as determined by the switch matrix configuration spreadsheet compiled from the UUT port spreadsheet and the instrument port spreadsheet) to be automatically inserted, both graphically and physically, between the DCP_HI port and the UUT P1-1 port. The switch is in the open position (both graphically and physically), and represents the physical signal routing from the DCP_HI port through the switch matrix 16 to the UUT port PI-1. The tracking feature logs this graphical connection. The graphical connection operation (and transparent physical connection) is repeated for each additional port connection to be made, as shown in FIG. 40 by switches R3C3, R6C2, R4C2, R8C2, R1C4 and R2C2. Each of these operations is logged by the tracking feature.

Figure 41:
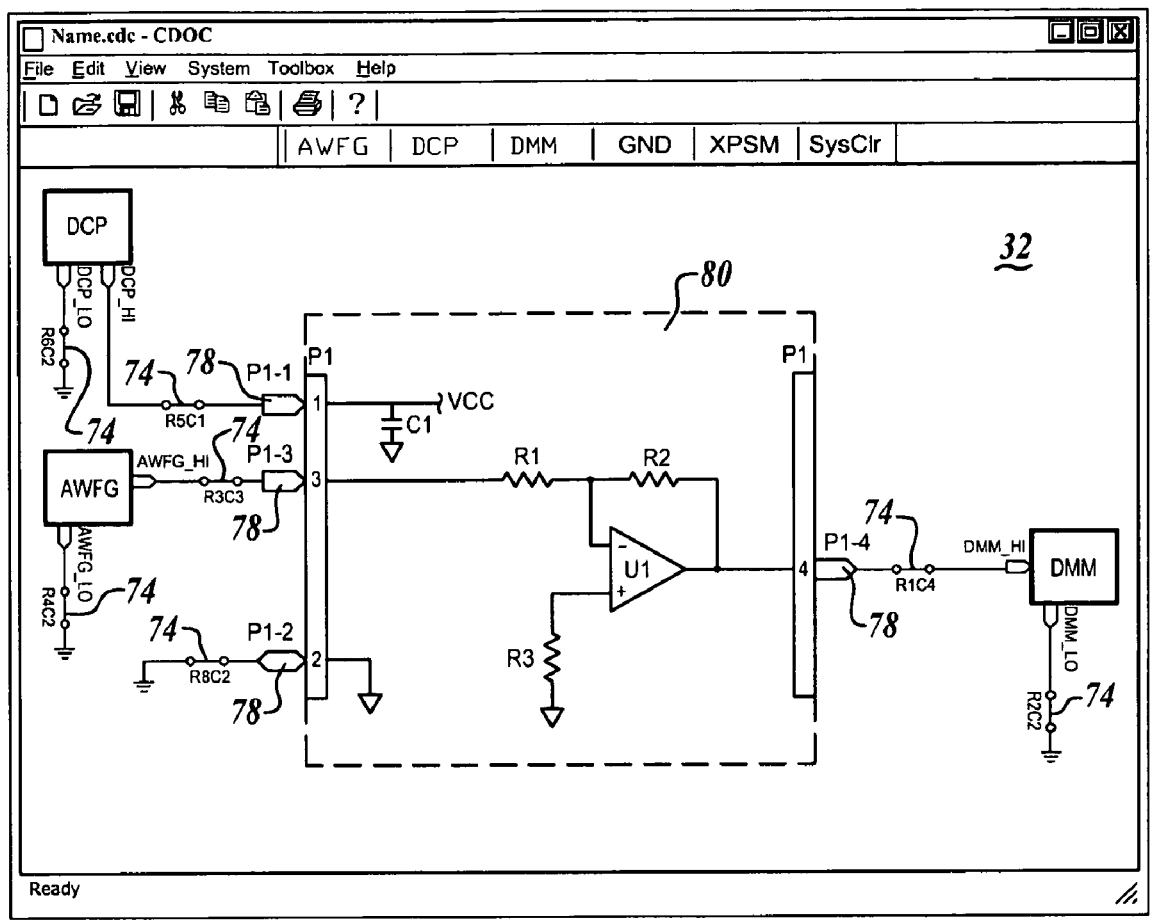
FIG. 41 illustrates the display screen shot of FIG. 40 showing switches on the graphical connections between instrument ports and circuit ports closed to permit the performance of test functions.

Next, the circuit connections may be completed by closing the switches that appear graphically, and as a result physically closing the switches in the matrix 16. Each switch icon includes a close field and an open field. Closing a switch can be accomplished by placing the cursor in the graphical close switch field and left-clicking. The tracking log is updated with each switch close action. To open the switch, the cursor is placed in the open switch field and left-clicked. With each action, the physical switch is configured to match the graphical switch display, and the action is logged by the tracking feature. FIG. 41 illustrates the virtual work environment 32 with all switches 74 in the closed configuration.

Corresponding to the UUT port definitions, the instrument port definitions, and the connections made as described above, the switch matrix configuration may appear as illustrated in FIGS. 42A and 42B. This example accounts for all of the switches of the cross-point switch matrix. As can be seen, once one port is connected to another port, the logical condition is satisfied to allow operation of the switch provided no conditional errors exist. The resultant graphical switch representation on screen provides visual verification and also provides the method to control the switch operation via graphical control.

At this point, the system is ready for diagnostic testing of the UUT. To power up the UUT, the power supply icon (DCP 88) is selected and (if necessary) enlarged. The current is graphically set to the desired level using the icon controls. The voltage is set to the desired potential. The "on" setting is selected. This action physically supplies voltage from the DCP to the UUT. The tracking feature continues to log each of these actions.

As a further example of a test function, the AWFG 86 may then be set (for example) to output a signal in a similar graphically controlled manner as that of the power supply. For example, the output could be set graphically for a 1.0 V p-p at 1,000 Hz sine wave, and this signal from the AWFG would be physically supplied to the UUT. The DMM may likewise be set to continuously measure the output voltage from the UUT in a graphically controlled manner. The function would be set (for example) to measure AC voltage. The range may be set for a maximum expected voltage of 10 VAC (for example). Tracking would log each operation performed, and may also log a measurement made and perform or branch to a pass/fail conditional routine.

With testing complete, the instruments may be cleared automatically by selecting "system clear" or may be placed in another condition by manually selecting the desired instrument icons and changing the function. The tracking feature continues to log these operations. At this point, with testing complete, the tracking file can be saved and/or closed for later use in testing other UUTs of the same CCA design.

EXAMPLE II

Figure 43:
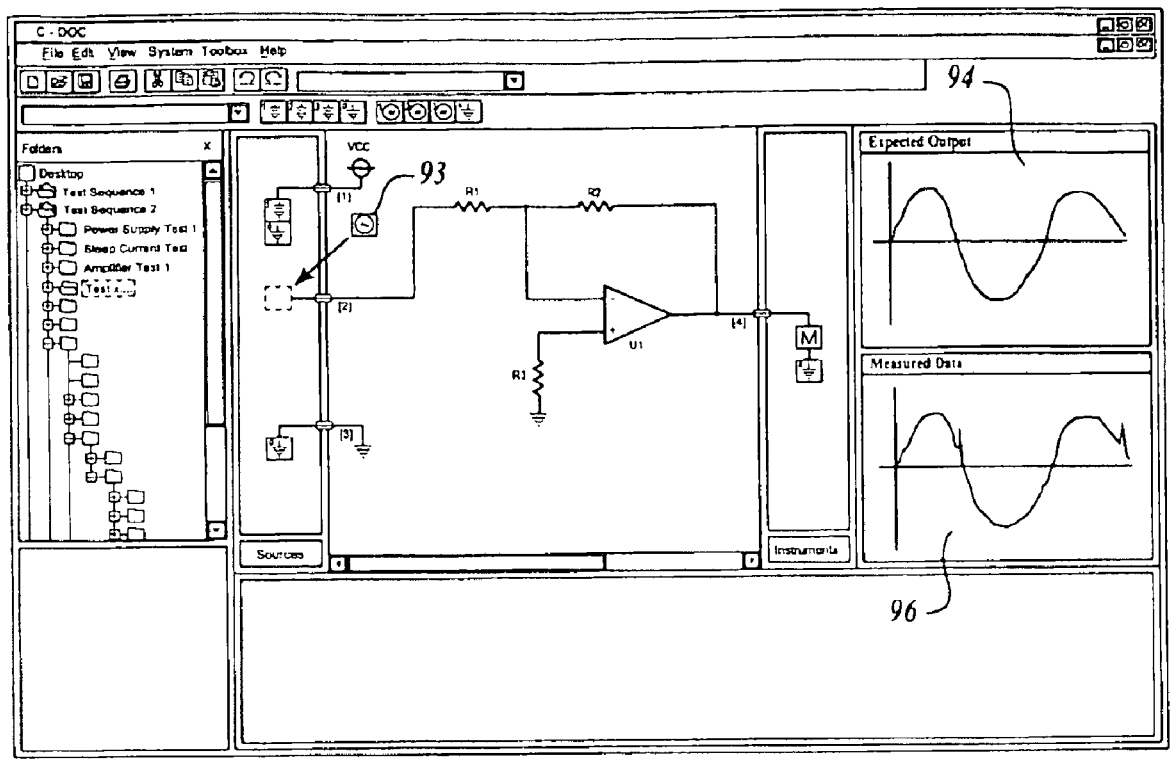
FIG. 43 demonstrates an exemplary display screen shot illustrating a circuit schematic graphically connected for testing and displayed actual test results compared to expected test results.

FIG. 43 illustrates the testing of another simple CCA, including one power supply connection, one reference (ground) connection, and one output signal voltage connection, using a different embodiment of display icons.

Dragging the reference (ground) icon to a point adjacent to the UUT schematic defined reference activates this function physically. Drawing a line from the reference icon to the UUT defined reference defines the connection routing through the cross-point matrix and inserts an open switch in series. The switch may be closed via icon control by selecting the switch. The switch may be toggled opened in the same manner.

Dragging a power supply icon to a point adjacent to the UUT schematic defined power connection port, as shown by arrow 93 in FIG. 43, activates this function. Drawing a line from the power supply reference to the UUT defined reference or the reference icon defines a graphical and corresponding physical connection routing through the cross-point matrix and inserts an open switch in series. The switch may be closed via icon control. Drawing a line from the power supply output port to the UUT defined power input port defines the graphical and physical connection routing through the cross-point matrix and inserts an open switch in series. The switch may be closed via icon control.

Dragging the measurement instrument icon (e.g., a DMM) to a point adjacent to the UUT schematic defined signal output port ctivates this function. Drawing a line from the Measurement Instrument reference to the UUT defined reference or the reference icon defines the connection routing through the cross-point matrix and inserts an open switch in series. The switch may be closed via icon control. Drawing a line from the measurement instrument input port to the UUT defined signal output port defines the graphical and physical connection routing through the cross-point matrix and inserts an open switch in series. The switch may be closed via icon control.

The measurement instrument (e.g., DMM) may be setup graphically to perform a function by selecting the instrument icon and then selecting from the functions available. The selected functions may be immediately invoked or invoked at a later time via user control. The icon may be enlarged or compressed. The measurement instrument may provide a continuous readout or update of test points of interest.

The power supply may be setup to output a specified voltage by selecting the power supply icon and then either entering numerically the desired voltage or selecting graphically the desired voltage. The power supply output may be invoked immediately or at a later time. Other power supply functions may be invoked via the same numerical or graphical control.

The test setup is now complete and the UUT is under test. If the test setup methodology was not invoked by activating the tracking feature to capture the station asset sequential use, the entire setup may be saved in a predetermined order by selecting a "save setup" function. The measured output values may be displayed (window 96 in FIG. 43), compared visually to an expected output (window 94 in FIG. 43), limits may be assigned, and the data may be captured and sent to a log file for analysis.

Typically, notes may be made on UUT schematics describing circuit functionality and the signals expected at certain nodes. An 'Add Note' feature allows the placing of notes and signal forms on the schematic. The notes are intended to be stored for recall.

Possible UUT setup errors may happen such that a catastrophic failure occurs when power is applied or unprotected input or output functions are wrongly connected. The cross-point matrix connection table may provide error-checking indications or may deny the closing of the cross-point matrix switch until the error conflict is resolved.

The UUT may be further tested in a variety of ways, instrument connections and setups being performed similarly as described, and each test sequence saved. An "automated test" or "sequencing" feature allows the creation of an automated test program by placing the name of each stored test sequence in an execution list. Execution list simulation is provided to identify conflicts between test sequences for resolution.

The test setup may be selectively removed and stored as a program sequence similar to that described or a 'Remove Test' feature will shutdown the system instrumentation in a pre-determined order.

The described UUT test setup sequence using GUI control provides a faster, more flexible, immediate realization for circuit card diagnostics and eliminates part of the need for costly formalized engineer developed automated test programs.

Enhanced diagnostics may include replacing the schematic diagram with a circuit-modeling diagram such as P-SPICE® by Cadence Design Systems, Inc., or ELECTRONICS WORKBENCH™. Incorporation may provide the technician with expected circuit output response with respect to the applied stimulus while the test system is measuring the actual real-time circuit response.

Enhanced test system interface capabilities may include adding voice recognition. This may allow the technician to verbally produce the test setup sequence or to verbally change instrumentation settings while performing other circuit diagnostics.

To achieve maximum interconnection flexibility a true cross-point switch matrix, rugged enough to withstand daily use, and with good line-to-line isolation and current carrying capability, may be designed. Suitably, the cross-point matrix would be infinite in width (row) and length (column) but practically this cannot be achieved. To approximate this, smaller independent cross-point matrix segments containing a core number of interconnection points may be designed. Cross-point matrix modules may be connected together to increase the width, the length, or both dimensions of the cross-point matrix. The cross-point matrix may be housed within the body of the worktable to minimize interconnection cable lengths or may be housed independent of the worktable.

Cross-point matrix switch control may be achieved via computer control. An independent controller, which may contain a combination of hardware and firmware, may provide the interface between the computer and the cross-point matrix. The controller may be housed independently or may be hosted within commercially available equipment. The controller may have the capability to control multiple cross-point matrix segments. Multiple controllers may be used for larger interconnection capability.

While the preferred embodiment of the invention has been illustrated and described, it will be appreciated that various changes to the disclosed solutions and methods can be made therein without departing from the spirit and scope of the invention. It is therefore intended that the scope of letters patent granted hereon be limited only by the definitions of the appended claims.

The embodiments of the invention in which an exclusive property or privilege is claimed are defined as follows:

1. A diagnostic system for testing a circuit (the "UUT") having input and/or output signal ports, comprising:
   one or more test instruments each defining input and/or output signal ports;
   an interface connectable to the UUT ports;
   a multipoint switch matrix connectable between the UUT interface and the instrument ports;
   a graphical display capable of displaying a schematic image of the UUT including the UUT ports and icons representing the instrument ports;
   a user input device;
   a processor capable of directing actual electrical connections made automatically between the UUT ports and the instrument ports, without the necessity for manually reconfiguring connections between the UUT ports and the instrument ports, via the switch matrix corresponding and in response to a user graphically indicating a desired connection between selected UUT ports and selected instrument ports, input through the input device and displayed graphically on the display, and capable of directing test functions input by the user to be performed on the UUT;
   a communications bus connected between and capable of communicating between the other system components; and
   a memory device capable of tracking and storing a sequence of the port connections and test function actions.

2. The diagnostic system of claim 1, further comprising a second display capable of interfacing with the user.

3. The diagnostic system of claim 1, wherein the switch matrix comprises a cross-point switch matrix.

4. The diagnostic system of claim 3, wherein the switch matrix comprises an array of undifferentiated rows and columns.

5. The diagnostic system of claim 1, wherein the display is capable of displaying a dumb schematic image of the UUT.

6. A diagnostic system for setting up a circuit (the "UUT") to be tested using one or more instruments, comprising:
   a multipoint switch matrix;
   an instrument interface connectable to the input and/or output signal ports of the one or more test instruments;
   a UUT interface connectable to input and/or output signal ports of the UUT;
   a display interface connectable to a graphical display;
   an input interface connectable to a user input device;
   a processor capable of communication with and directing automatic creation of actual electrical connections between selected UUT ports and selected instrument ports, without the necessity for manually reconfiguring connections between the selected UUT ports and the selected instrument ports, via the switch matrix corresponding and in response to a user graphically indicating a desired connection between the selected UUT ports and the selected instrument ports, input through the input device and displayed graphically on the display; and a memory device capable of storing the connections.

7. The diagnostic system of claim 6, wherein the processor is capable of directing test functions input by the user to be performed on the UUT, and the memory device is capable of storing a sequence of the test function actions.

8. A method for testing an electronic circuit using one or more test instruments, comprising:

displaying graphical images of the one or more test instruments and a schematic image of the circuit on a display, the test instrument images and the circuit schematic image each defining one or more signal ports;

graphically connecting the instrument ports to the circuit schematic ports by indicating a desired connection between selected circuit schematic ports and selected instrument ports;

automatically making actual electrical connections between the circuit ports to the instrument ports, without the necessity for manually reconfiguring connections between the circuit ports and the instrument ports, via a switch matrix corresponding and in response to the graphical connections;

inputting test functions to be performed on the circuit using the instruments; and tracking and storing a sequence of the port connection and test function actions.

9. The method of claim 8, further comprising performing the stored sequence of port connection and test function actions on one or more additional units of the electronic circuit.

10. The method of claim 8, wherein the test functions are input graphically on the display.

11. The method of claim 8, wherein the displayed circuit schematic image comprises a dumb schematic image.

12. The method of claim 8, further comprising adding graphical note images to the displayed circuit schematic image.

13. The method of claim 8, further comprising chaining together a plurality of port connection and/or test function action sequences to create an integrated test sequence.

14. The method of claim 8, further comprising displaying an instrument icon image that indicates the state of operability of the instrument.

15. A method for creating a test routine for an electronic circuit, comprising:

displaying a graphical image of one or more test instruments and a schematic of a circuit to be tested on a display, the test instrument images and the circuit schematic image each defining one or more signal ports;

graphically indicating a connection between selected instrument ports and selected circuit schematic ports on the display;

inputting test functions to be performed on the circuit using the instruments; and tracking and storing a sequence of the port connection and test function actions.

16. The method of claim 15, wherein the schematic displayed is a dumb schematic.

17. The method of claim 15, wherein the schematic displayed is a smart schematic.

18. A method for creating a test setup for an electronic circuit, comprising:

displaying a graphical image of one or more test instruments and a schematic of a circuit to be tested on a display, the test instrument images and the circuit schematic image each defining one or more signal ports;

graphically indicating a connection between selected instrument ports and selected circuit schematic ports on the display; and automatically making actual electrical connections between the selected ports of the circuit to the selected ports of the instruments, without the necessity for manually reconfiguring connections between the selected circuit ports and the selected instrument ports, corresponding and in response to the graphical connections.

19. The method of claim 18, wherein the electrical connection of the ports is performed via an automatic multi-point switch matrix.

20. The method of claim 18, further comprising tracking and storing a sequence of the port connection actions.

21. The method of claim 18, further comprising inputting a sequence of test functions to be performed on the circuit using the instruments, and performing the test function sequence on the circuit using the instruments.

\* \* \* \* \*